United States Patent
Wu et al.

(10) Patent No.: US 7,652,320 B2
(45) Date of Patent: Jan. 26, 2010

(54) NON-VOLATILE MEMORY DEVICE HAVING IMPROVED BAND-TO-BAND TUNNELING INDUCED HOT ELECTRON INJECTION EFFICIENCY AND MANUFACTURING METHOD THEREOF

(75) Inventors: Min-Ta Wu, Hsinchu (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 250 days.

(21) Appl. No.: 11/070,226

(22) Filed: Mar. 3, 2005

(65) Prior Publication Data

US 2006/0197139 A1    Sep. 7, 2006

(51) Int. Cl.
    *H01L 29/10*    (2006.01)
(52) U.S. Cl. ............... 257/316; 257/E29.056; 257/E29.264; 257/E29.304
(58) Field of Classification Search ........... 438/954; 257/324, 316, E29.056, E29.264, E29.304
    See application file for complete search history.

(56) References Cited

U.S. PATENT DOCUMENTS

| | | | | |
|---|---|---|---|---|
| 4,652,897 A * | 3/1987 | Okuyama et al. | ............ | 257/316 |
| 5,100,819 A * | 3/1992 | Gill et al. | ............ | 438/263 |
| 5,674,764 A * | 10/1997 | Liu et al. | ............ | 438/257 |
| 5,898,614 A * | 4/1999 | Takeuchi | ............ | 365/185.1 |
| 6,133,098 A * | 10/2000 | Ogura et al. | ............ | 438/267 |
| 6,380,038 B1 * | 4/2002 | Yu | ............ | 438/300 |
| 6,501,124 B2 * | 12/2002 | Kim | ............ | 257/316 |
| 6,630,384 B1 | 10/2003 | Sun et al. | | |
| 6,653,685 B2 * | 11/2003 | Katayama et al. | ............ | 257/324 |
| 6,727,128 B2 * | 4/2004 | Sridevan | ............ | 438/197 |
| 6,771,545 B1 | 8/2004 | Hsia et al. | | |
| 2003/0155599 A1 * | 8/2003 | Hsu et al. | ............ | 257/296 |
| 2004/0051134 A1 | 3/2004 | Jang et al. | | |
| 2004/0084718 A1 * | 5/2004 | Hung et al. | ............ | 257/317 |
| 2004/0100822 A1 * | 5/2004 | Roizin et al. | ............ | 365/185.03 |
| 2004/0219802 A1 | 11/2004 | Park et al. | | |
| 2005/0012159 A1 * | 1/2005 | Sekimoto | ............ | 257/379 |
| 2005/0194633 A1 * | 9/2005 | Mori | ............ | 257/324 |
| 2006/0197139 A1 | 9/2006 | Wu et al. | | |
| 2007/0037328 A1 | 2/2007 | Ho et al. | | |
| 2007/0059945 A1 * | 3/2007 | Mohklesi | ............ | 438/778 |

OTHER PUBLICATIONS

R. Shirota et al., "An Accurate Model of Subbreakdown Due To Band-To-Band Tunneling and Its Application," IEDM, Dec. 1988, pp. 26-29.
T. Ohnakado et al., "Novel Electron Injection Method Using Band-to-Band Tunneling Induced Hot Electron (BBHE) for Flash memory with a P-channel Cell," IEDM, Dec. 1995, pp. 279-282.

* cited by examiner

*Primary Examiner*—Minh-Loan T Tran
*Assistant Examiner*—W. Wendy Kuo
(74) *Attorney, Agent, or Firm*—Finnegan, Henderson, Farabow, Garrett & Dunner, LLP

(57) ABSTRACT

A semiconductor device includes a semiconductor substrate having a first conductivity type. The semiconductor substrate includes a first diffusion region having the first conductivity type, a second diffusion region having the first conductivity type, and a channel region between the first diffusion region and the second diffusion region. The device further includes a control gate over the channel region and at least one sub-gate over the first and second diffusion regions.

21 Claims, 26 Drawing Sheets

NON-VOLATILE MEMORY DEVICE HAVING IMPROVED BAND-TO-BAND TUNNELING INDUCED HOT ELECTRON INJECTION EFFICIENCY AND MANUFACTURING METHOD THEREOF

TECHNICAL FIELD

This invention is in general related to a method for improving a programming efficiency of a p-channel memory device and, more particularly, to a method for improving a band-to-band tunneling induced hot electron (BTBTHE) injection efficiency for a p-channel non-volatile memory device with sub-gate.

BACKGROUND

Memory devices for non-volatile storage of information are widely used. Examples of such memory devices include read only memory (ROM), programmable ROM (PROM), erasable programmable ROM (EPROM), electrically erasable programmable ROM (EEPROM), and flash EEPROM. A flash memory generally refers to a flash EEPROM, which may be erased in blocks of data instead of one byte at a time.

A flash memory device generally includes an array of memory cells arranged in rows and columns. Each memory cell includes a MOS transistor structure having a gate, a drain, a source, and a channel defined between the drain and the source. The gate corresponds to a word line, and the drain or source corresponds to a bit line of the memory array. A conventional flash memory cell generally includes a trapping layer provided between the gate and the channel. The trapping layer may be a floating gate formed of polysilicon or a dielectric such as silicon nitride. When the gate, the drain, and the source of the memory cell are appropriately biased, charge carriers (electrons or holes) may be forced to tunnel or inject into the trapping layer, which traps the carriers. As a result, the memory cell is programmed or erased. The memory cell may be read or erased by applying different biases to the gate, the drain, and the source thereof.

SUMMARY OF THE INVENTION

Consistent with embodiments of the present invention, there is provided a semiconductor device including a semiconductor substrate having a first conductivity type. The semiconductor substrate includes a first diffusion region having the first conductivity type, a second diffusion region having the first conductivity type, and a channel region between the first diffusion region and the second diffusion region. The device further includes a control gate over the channel region and at least one sub-gate over the first and second diffusion regions.

Consistent with embodiments of the present invention, there is also provided a memory device that includes a semiconductor substrate having a first conductivity type and a plurality of memory cells arranged in a plurality of rows each corresponding to one of a plurality of word lines and a plurality of columns each corresponding to one of a plurality of bit lines. Each memory cell includes a first diffusion region having the first conductivity type in the semiconductor substrate, a second diffusion region having the first conductivity type in the semiconductor substrate, a channel region as a portion of the semiconductor substrate between the first and second diffusion regions, a control gate over the channel region, and at least one sub-gate over the first and second diffusion regions, wherein the control gate is connected to the corresponding one of the word lines. The device further includes a plurality of third diffusion regions having a second conductivity type, wherein each bit line includes two of the third diffusion regions at the ends of the corresponding bit line.

Consistent with embodiments of the present invention, there is also provided a method of operating a memory cell including at least one of resetting the memory cell, erasing the memory cell, programming the memory cell, and reading the memory cell. The memory cell is formed on an $n^-$ semiconductor substrate, and includes a first $n^-$ diffusion region and a second $n^-$ diffusion region in the semiconductor substrate, a channel region in the semiconductor substrate between the first $n^-$ diffusion region and the second $n^-$ diffusion region, a control gate over the channel region, and at least one sub-gate over the first and second $n^-$ diffusion regions, wherein the first and second $n^-$ diffusion regions have higher doping concentrations than the $n^-$ semiconductor substrate.

Consistent with embodiments of the present invention, there is also provided a method of operating a memory device, wherein the memory device is formed on an $n^-$ semiconductor substrate and includes a plurality of memory cells arranged in a plurality of rows each corresponding to one of a plurality of word lines and a plurality of columns each corresponding to one of a plurality of bit lines. The method includes at least one of resetting the memory device, erasing the memory device, programming a selected memory cell, and reading a selected memory cell. Each memory cell includes a first $n^-$ diffusion region in the semiconductor substrate, a second $n^-$ diffusion region in the semiconductor substrate, a channel region defined as a portion of the semiconductor substrate between the first and second $n^-$ diffusion regions, a control gate over the channel region, and at least one sub-gate over the first and second diffusion regions, wherein the fist and second $n^-$ diffusion regions have higher doping concentrations than the semiconductor substrate, and wherein each word line connects the control gates of the memory cells in the same row. The memory device also includes a plurality of $p^+$ diffusion regions, wherein each bit line includes two of the $p^+$ diffusion regions at the ends of the corresponding bit line.

Consistent with embodiments of the present invention, there is further provided a method for manufacturing a semiconductor device that includes providing a semiconductor substrate having a first conductivity type, forming a control gate over the semiconductor substrate, forming at least one diffusion region having the first conductivity type in the semiconductor substrate by ion implantation, using the control gate structure as a mask, and forming at least one sub-gate over the at least one diffusion region.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings:

FIGS. 6C-7G illustrate operations of the memory array of FIGS. 6A and 6B consistent with the second embodiment of the present invention;

FIG. 7 shows a cross-sectional view of a memory cell consistent with a third embodiment of the present invention;

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

In memory devices utilizing carrier tunneling for programming and erasing operations, electron tunneling has proven to be more efficient than hole tunneling. Therefore, a memory cell formed of a p-type MOS transistor, which utilizes band-to-band tunneling induced hot electron injection (BTBTHE), is generally faster and requires lower power during programming, as compared to a memory cell formed of an n-type MOS transistor. One such p-type memory device utilizing BTBTHE is illustrated in FIG. 1.

Figure 1:
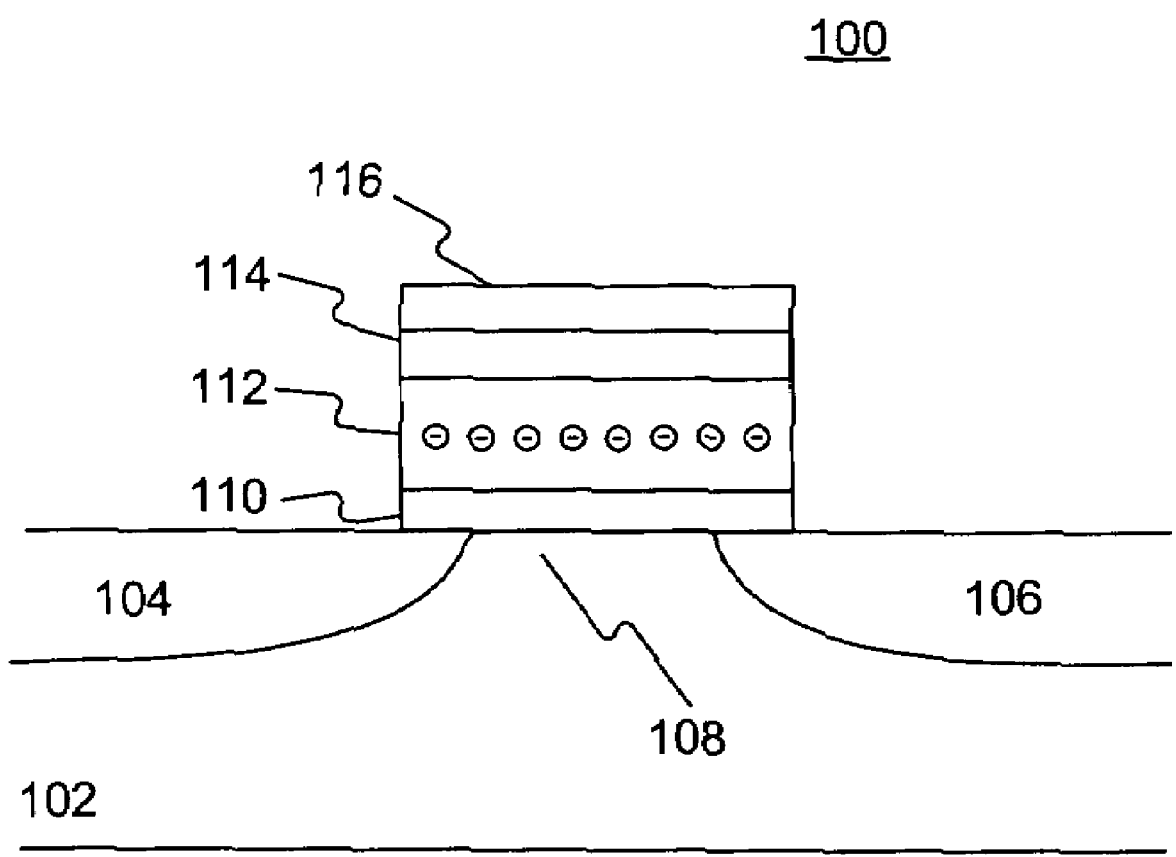
FIG. 1 shows the structure of a p-type memory cell.

In FIG. 1, a memory cell 100 is formed on an n-type semiconductor substrate 102 and includes two p-type diffusion regions 104 and 106, a channel region 108 between diffusion regions 104 and 106, a first insulating layer 110, a trapping layer 112, a second insulating layer 114, and a control gate 116. Memory device 100 is a p-type MOS transistor, with diffusion regions 104 and 106 respectively acting as the source and drain thereof. By applying appropriate biases to control gate 116 and diffusion regions 104 and 106, electrons may tunnel into and out of trapping layer 112, as a result of which memory cell 100 may be programmed or erased.

Trapping layer 112 is formed of a dielectric such as silicon nitride. Thus, when electrons tunnel into trapping layer 112, the electrons become relatively immobile. By controlling the biases on control gate 116, source 104, and drain 106, it is possible to control which part of trapping layer 112 the electrons tunnel into. Therefore, trapping layer 112 may be divided into two parts, a first bit adjacent to source 104 and a second bit adjacent to drain 106, each for the storage of one bit of information. The first bit and the second bit may be respectively programmed, read, or erased. For example, the first bit may be programmed by applying 5V to control gate 116, −5V to source 104, and 0V to drain 106.

Diffusion regions 104 and 106 of memory cell 100 are p$^+$ regions, the formation of which may be difficult to control during the manufacturing process of memory cell 100. For example, when channel 108 is very short, lateral diffusion of boron ions could degrade the performance of memory cell 100.

Figure 2:
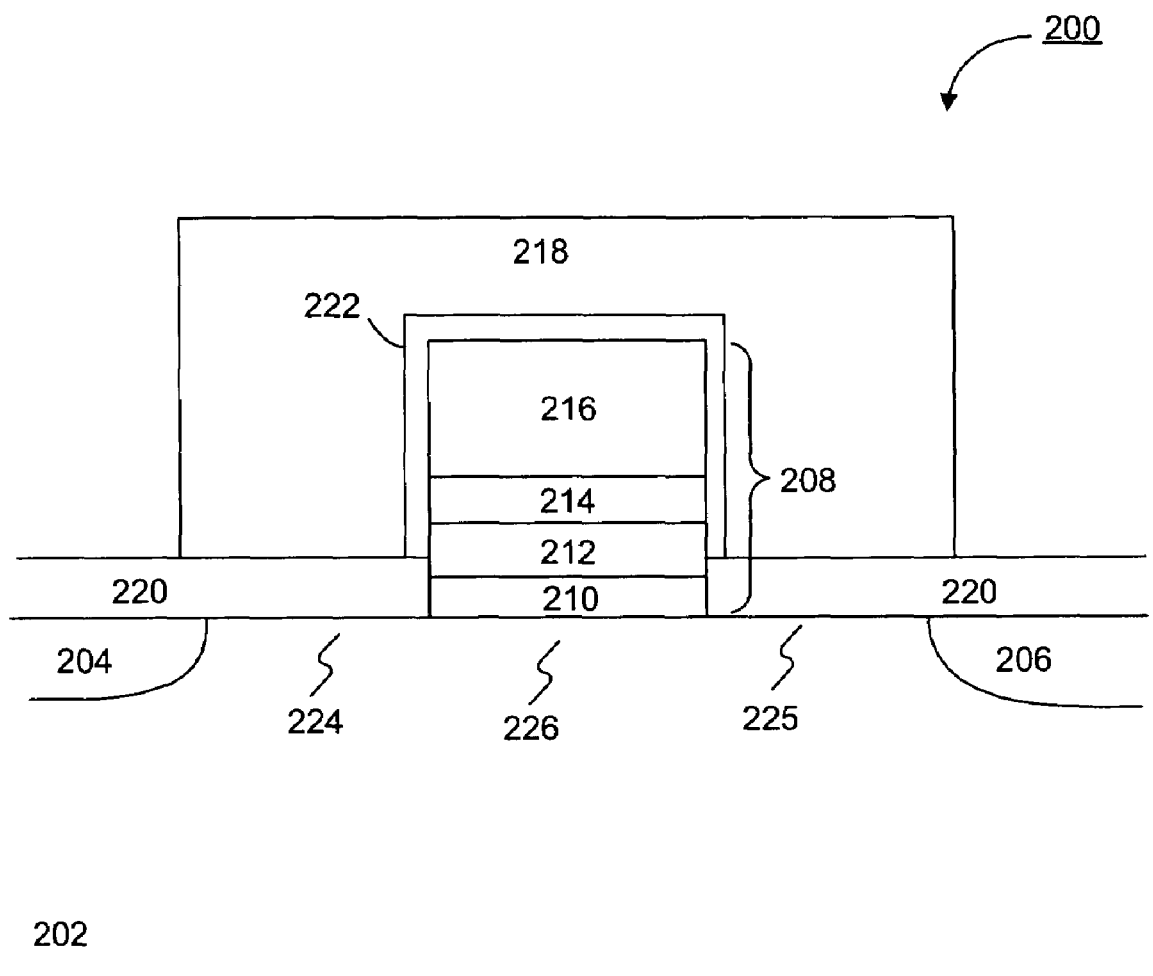
FIG. 2 shows the structure of a memory cell including a sub-gate.

To prevent lateral diffusion of boron ions, diffusion regions 104 and 106 may be replaced with inversion regions controlled by a sub-gate. FIG. 2 shows the structure of a memory cell 200 having a sub-gate for controlling inversion regions.

Memory cell 200 is formed on an n$^-$ semiconductor substrate 202 including p$^+$ diffusion regions 204 and 206. Memory cell 200 includes a multi-layer gate structure 208 formed on semiconductor substrate 202. Gate structure 208 is between and spaced apart from diffusion regions 204 and 206. Gate structure 208 includes a first insulating layer 210, a trapping layer 212, a second insulating layer 214, and a control gate 216. First insulating layer 210, trapping layer 212, and second insulating layer 214 may constitute an ONO (oxide-nitride-oxide) structure, wherein first insulating layer 210 comprises silicon dioxide, trapping layer 212 comprises silicon nitride, and second insulating layer 214 comprises silicon dioxide. Control gate 216 may comprise polysilicon, a metal, or a metal silicide, or a combination thereof. For example, control gate 216 may comprise a combination of polysilicon and tungsten silicide (WSi).

Memory cell 200 includes two inversion regions 224 and 225 and a channel region 226. Inversion region 224 is defined as a portion of semiconductor substrate 202 between gate structure 208 and diffusion region 204, inversion region 225 is defined as a portion of semiconductor substrate 202 between gate structure 208 and diffusion region 206, and channel region 226 is defined as a portion of semiconductor substrate 202 between inversion regions 224 and 225, i.e., below gate structure 208.

Memory cell 200 also includes a sub-gate 218 provided over inversion regions 224 and 225 and gate structure 208. Sub-gate 218 may comprise polysilicon, a metal, or a metal silicide, or a combination thereof. Sub-gate 218 is electrically isolated from inversion regions 224 and 225 by a layer of gate dielectric 220, and electrically isolated from gate structure 208 by an insulating spacer 222. Gate dielectric 220 may comprise an oxide. Insulating spacer 222 may comprise an oxide or an ONO layer.

Figure 3A:
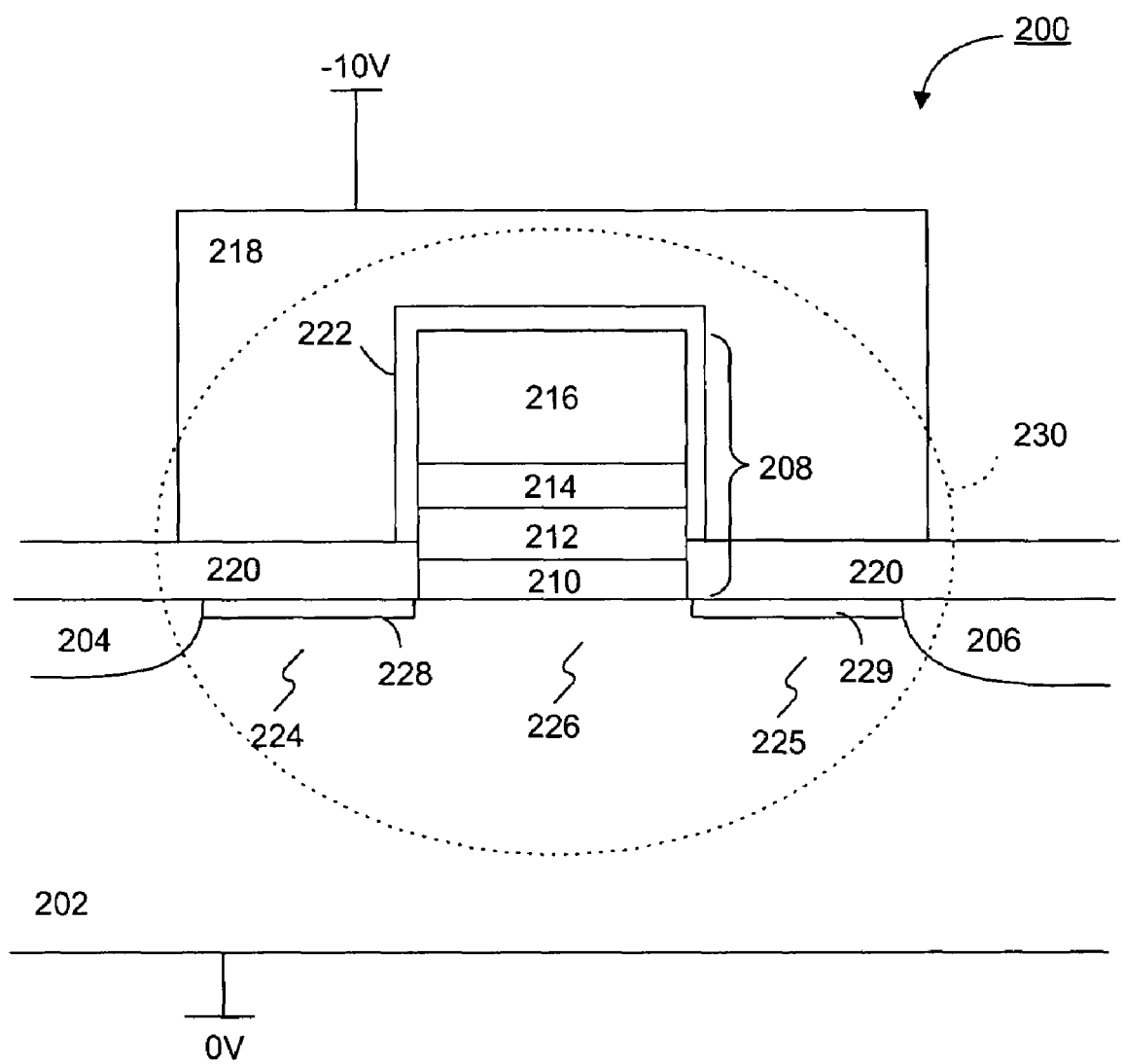
FIGS. 3A-3D illustrate operations of the memory cell of FIG. 2.

By applying appropriate biases to sub-gate 218 and semiconductor substrate 202, shallow p-type regions resulting from inversion may be formed in inversion regions 224 and 225. For example, in FIG. 3A, semiconductor substrate 202 is grounded and sub-gate 218 is biased at −10V. If the MOS structure comprising sub-gate 218, gate dielectric 220, and semiconductor substrate 202 has a threshold voltage $V_{T0}$ (negative in sign), then when the bias on sub-gate 218 is lower than the bias on semiconductor substrate 202 by an amount greater than $|V_{T0}|$, inversion occurs in both inversion regions 224 and 225. In this case, holes accumulate near the surface of n-type semiconductor substrate 202 in inversion regions 224 and 225, and shallow p-type regions 228 and 229 are formed (FIG. 3A). Depending on the biases to sub-gate 218 and semiconductor substrate 202, the hole concentration in p-type regions 228 and 229 may be controlled. Particularly, a more negative bias on sub-gate 218 results in a higher hole concentration in p-type regions 228 and 229.

Figure 3B:
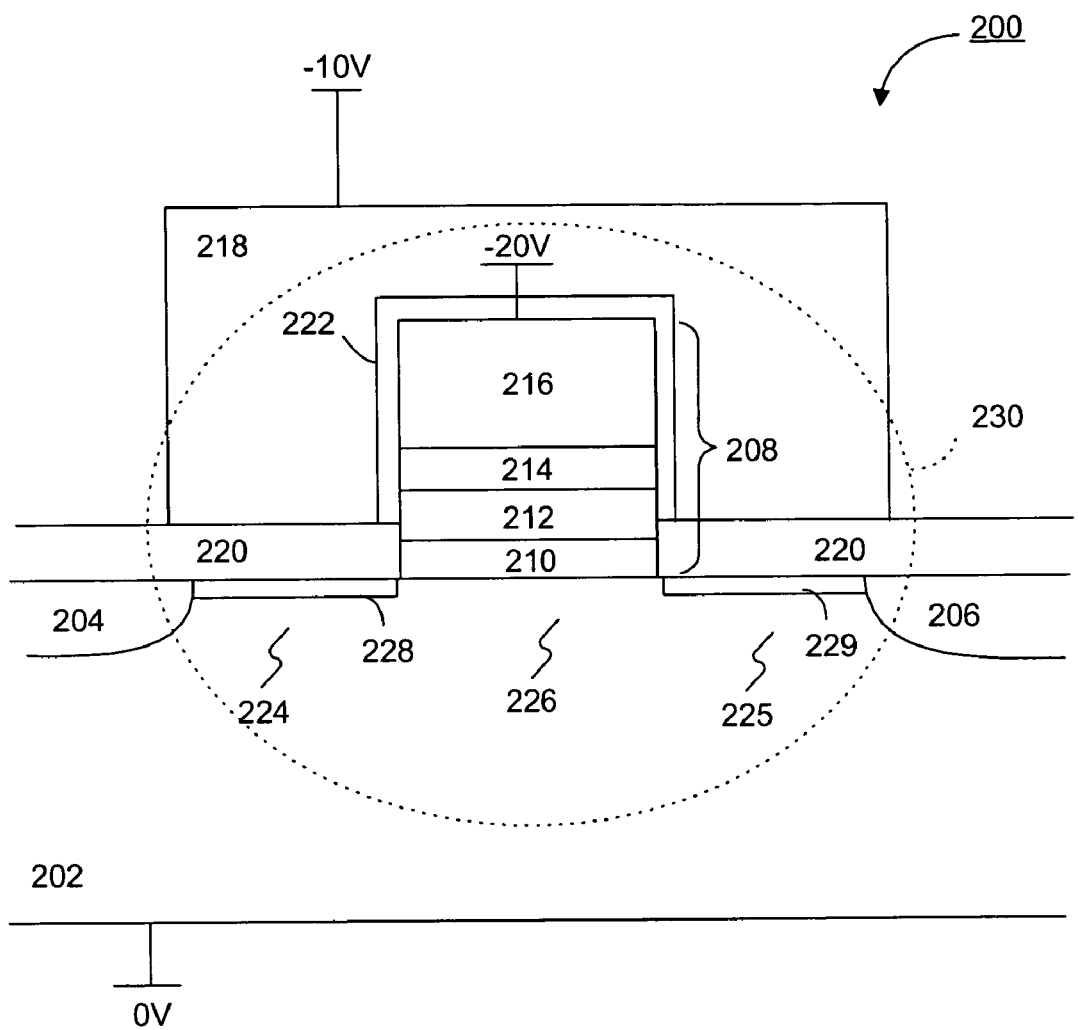
Figure 3C:
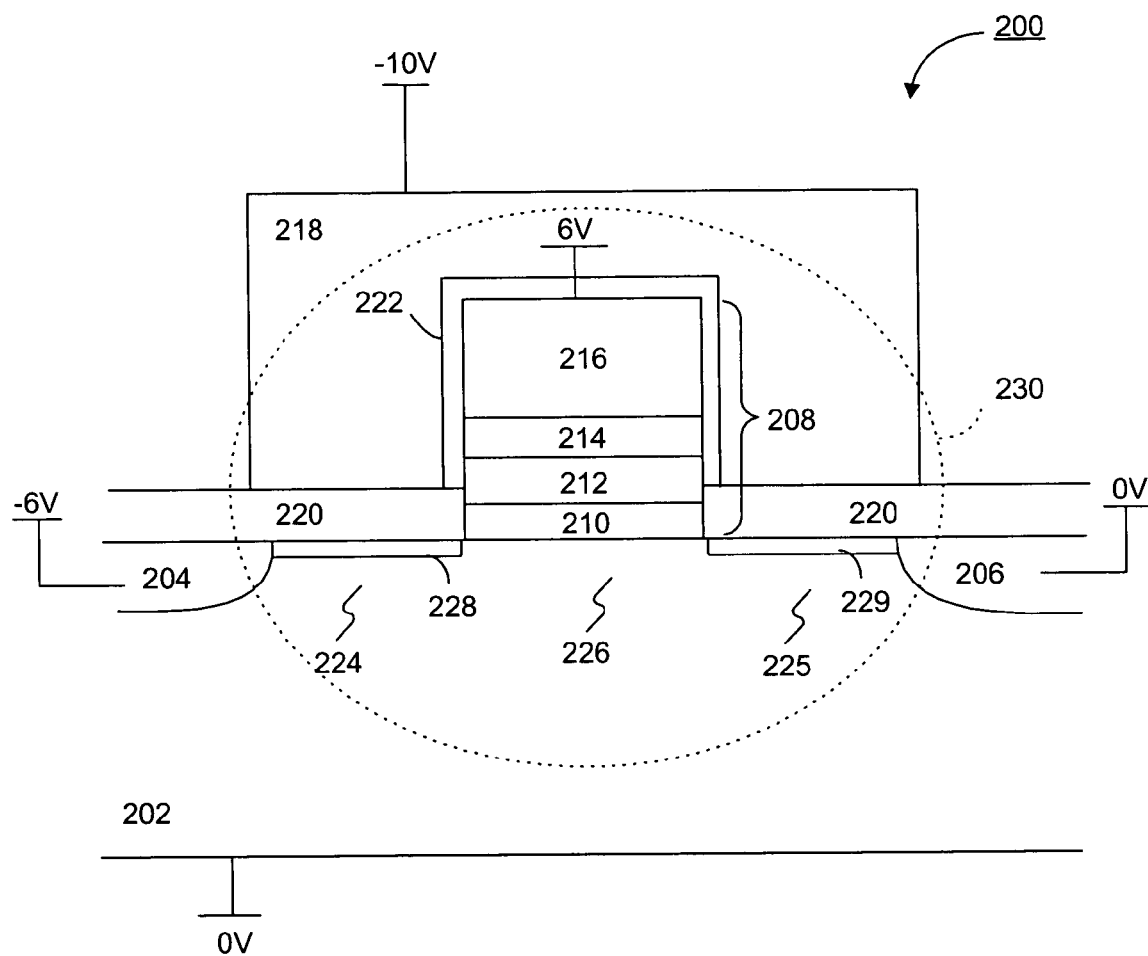
Figure 3D:
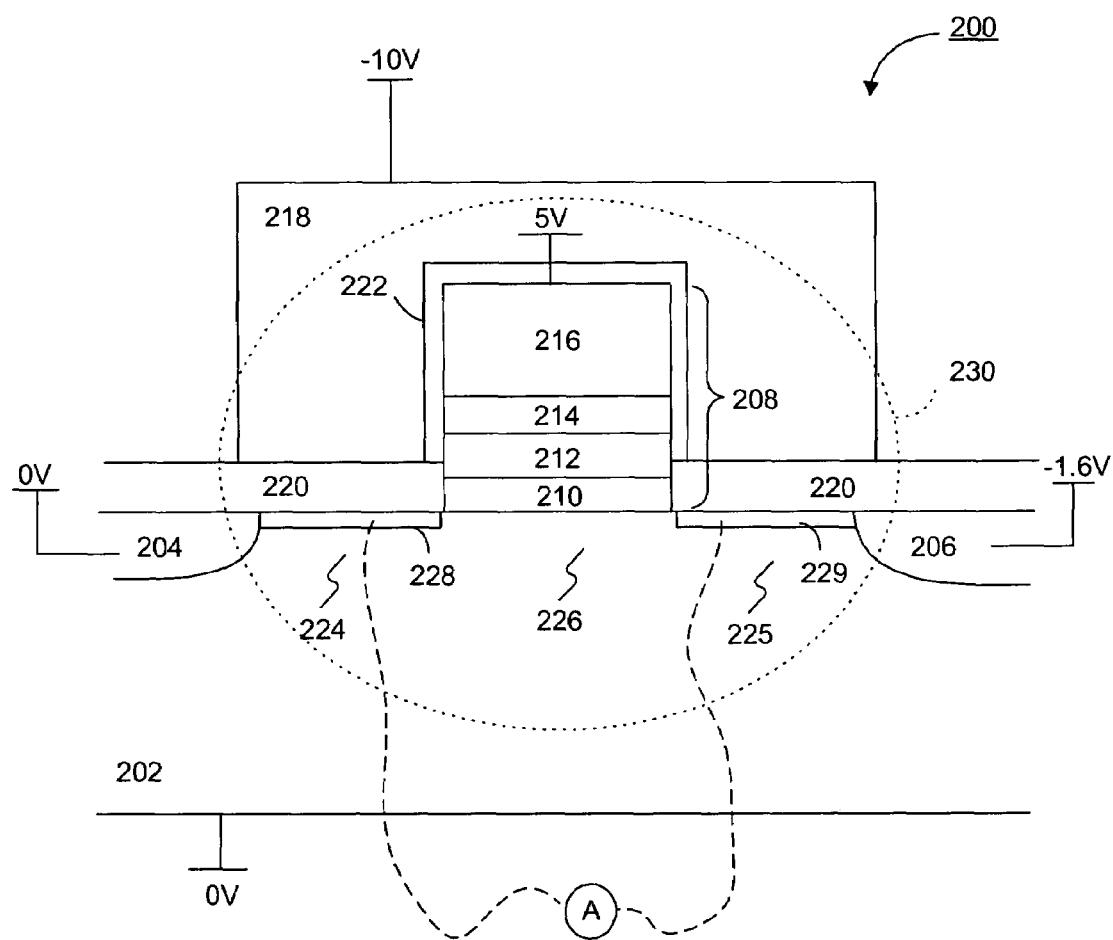

As shown in FIG. 3A, p-type regions 228 and 229 and gate structure 208 collectively constitute a p-type MOS transistor 230, where shallow p-type regions 228 and 229 are the source and drain of MOS transistor 230. Because of trapping layer 212 in gate structure 208, MOS transistor 230 may be used to store two bits of information. For example, as shown in FIG. 3B, memory cell 200 may be erased or reset by applying a high negative voltage, e.g., −20V, to control gate 216, and grounding semiconductor substrate 202. As a result of the erasure or reset, the threshold voltage of MOS transistor 230 may be, e.g., 4V. As shown in FIG. 3C, a first bit of memory cell 200 corresponding to inversion region 228 may be programmed by biasing sub-gate 218 at a negative voltage, e.g., −10V, control gate 216 at a positive voltage, e.g., 6V, diffusion region 204 at a negative voltage, e.g., −6V, and both diffusion region 206 and semiconductor substrate 202 at, e.g., 0V. The threshold voltage of MOS transistor 230 in the programmed state may be, e.g., 6V. As shown in FIG. 3D, the first bit of memory cell 200 may be read by biasing sub-gate 218 at, e.g., −10V, control gate 216 at, e.g., 5V, diffusion region 204 at, e.g., 0V, diffusion region 206 at, e.g., −1.6V, and semiconductor substrate 202 at, e.g., 0V, and measuring a current through channel region 226. Because the bias across control gate 216 and p-type inversion region 228 is greater than the threshold voltage of MOS transistor 230 in the reset or erased state (4V) but less than that in the programmed state (6V), a current is detected if the first bit of memory cell 200 has been programmed, and no current is detected if the first bit of memory cell 200 is not programmed or is in the reset state. Further, if the biases on diffusion regions 228 and 229 are switched in FIGS. 3C and 3D, a second bit of memory cell 200 may be programmed and read, respectively.

Figure 4:
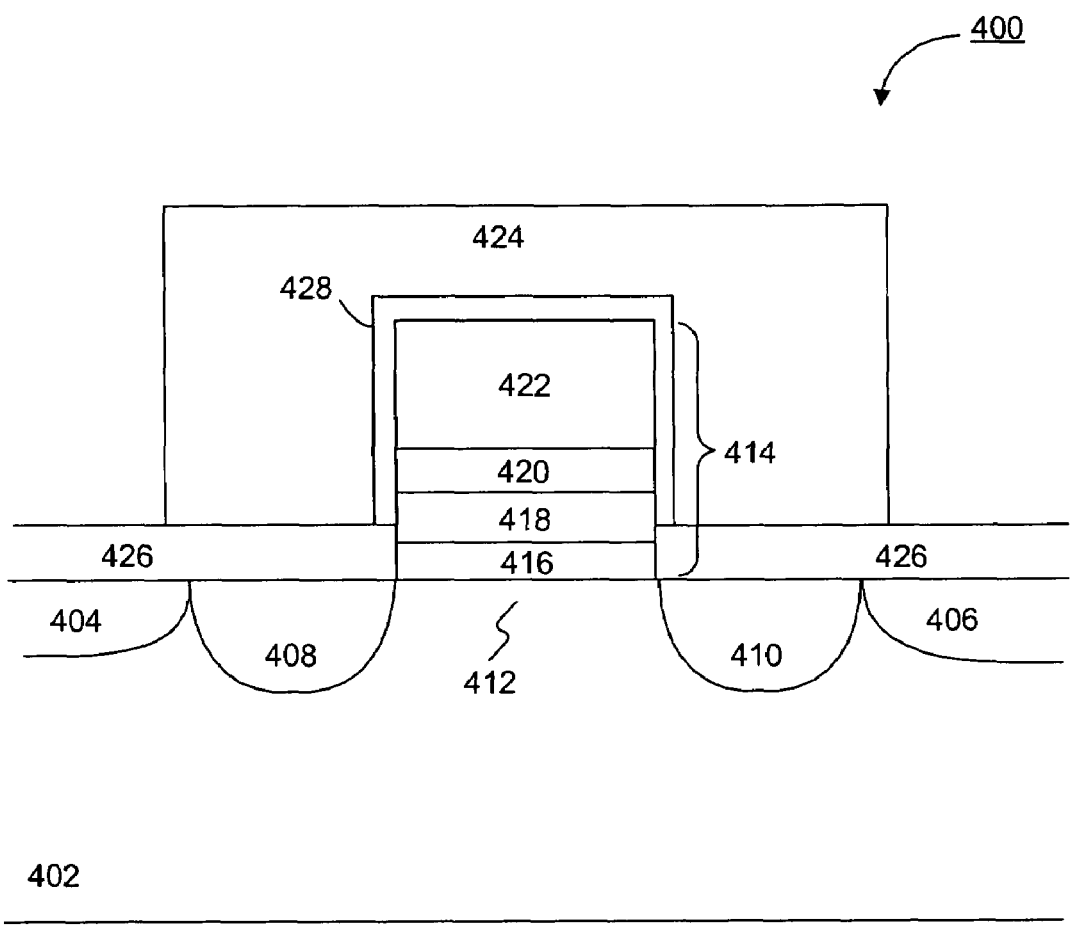
FIG. 4 shows the structure of a memory cell consistent with a first embodiment of the present invention.

Consistent with a first embodiment of the present invention, there is provided a novel memory device having a higher efficiency of hot electron injection during programming as compared to memory cell 200. FIG. 4 shows the structure of a memory cell 400 of a memory device consistent with the first embodiment of the present invention.

Memory cell 400 is formed on an n⁻ semiconductor substrate 402. Semiconductor substrate 402 includes p⁺ diffusion regions 404 and 406 spaced apart from each other and n⁻ diffusion regions 408 and 410 spaced apart from each other. N⁻ diffusion regions 408 and 410 have higher concentrations of n-type dopants than n⁻ semiconductor substrate 402. N⁻ diffusion regions 408 and 410 are between p⁺ diffusion regions 404 and 406, where n⁻ diffusion region 408 is adjacent to p⁺ diffusion region 404 and n⁻ diffusion region 410 is adjacent to p⁺ diffusion region 406. A channel region 412 is defined between n⁻ diffusion regions 408 and 410.

Memory cell 400 includes a multi-layer gate structure 414 formed over channel region 412. Gate structure 414 includes a first insulating layer 416, a trapping layer 418 over first insulating layer 416, a second insulating layer 420 over trapping layer 418, and a control gate 422 over second insulating layer 420. First insulating layer 416, trapping layer 418, and second insulating layer 420 may constitute an ONO structure, wherein first insulating layer 416 comprises silicon dioxide, trapping layer 418 comprises silicon nitride, and second insulating layer 420 comprises silicon dioxide. Control gate 422 may comprise polysilicon, a metal, or a metal silicide, or a combination thereof. For example, control gate 422 may comprise a combination of polysilicon and tungsten silicide (WSi).

Memory cell 400 also includes a sub-gate 424 provided over n⁻ diffusion regions 408 and 410. Sub-gate 424 may comprise polysilicon, a metal, or a metal silicide, or a combination thereof. Sub-gate 424 is electrically isolated from n⁻ diffusion regions 408 and 410 by a layer of gate dielectric 426, and electrically isolated from gate structure 414 by an insulating spacer 428. Gate dielectric 426 may comprise an oxide. Insulating spacer 428 may comprise an oxide or an ONO nitride.

By applying appropriate biases to sub-gate 424 and semiconductor substrate 402, shallow p-type inversion regions may be formed in n⁻ diffusion regions 408 and 410. For example, in FIG. 5A, semiconductor substrate 402 is grounded and sub-gate 424 is biased at −10V. If the MOS structure comprising sub-gate 424, gate dielectric 426, and n⁻ diffusion regions 408 or 410 has a threshold voltage $V_{TH}$ (negative in sign), then when the bias on sub-gate 424 is lower than the bias on semiconductor substrate 402 by an amount greater than $|V_{TH}|$, inversion occurs in n⁻ diffusion regions 408 and 410 near the interface between gate dielectric 426 and n⁻ diffusion regions 408 and 410, and shallow p-type inversion regions 430 and 432 are formed.

Figure 5A:
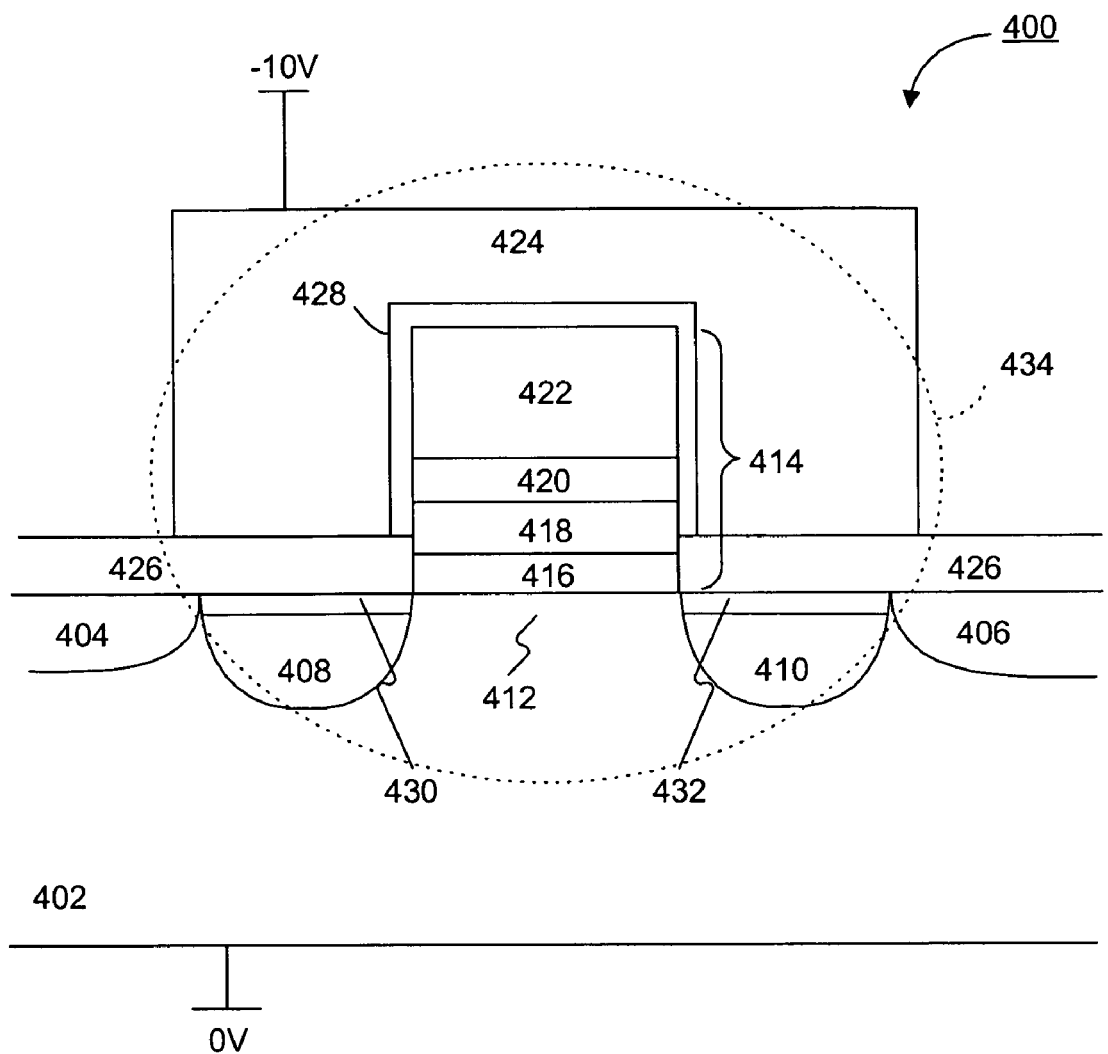
FIGS. 5A-5D illustrate operations of the memory cell of FIG. 4.

As shown in FIG. 5A, p-type inversion regions 430 and 432 and gate structure 414 constitute an MOS transistor 434, with p-type inversion regions 430 and 432 respectively acting as the source and drain thereof. Because MOS transistor 434 includes a trapping layer 418, memory cell 400 may be operated as a 2-bit memory cell, with the two bits of information stored in opposite sides of trapping layer 418. The operations of memory cell 400 are discussed in detail below.

Figure 5B:
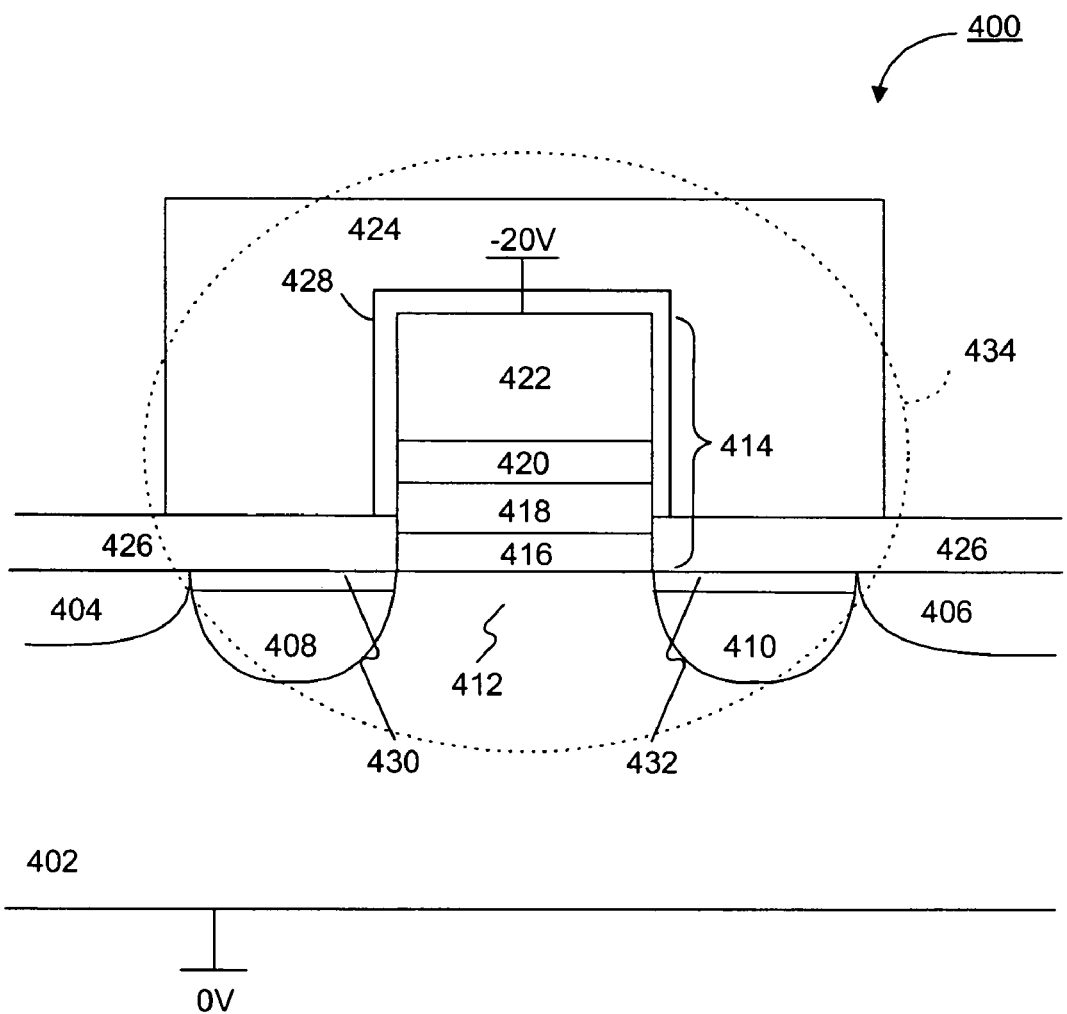

As shown in FIG. 5B, memory cell 400 may be erased or reset by applying a high negative voltage, e.g., −20V, to control gate 422, and grounding semiconductor substrate 402. This causes a strong vertical electric field to be created across gate structure 414, under which electrons tunnel from control gate 422, through second insulating layer 420, into trapping layer 418, and from trapping layer 418, through first insulating layer 416, into semiconductor substrate 402. When a dynamic balance is reached, memory cell 400 is reset. In the reset state, the concentration of electrons in trapping layer 418 may be such that a threshold voltage, $V_{TH-R}$, of MOS transistor 434 is positive, e.g., 4V. In other words, MOS transistor 434 is on even when no biases are applied.

Figure 5C:
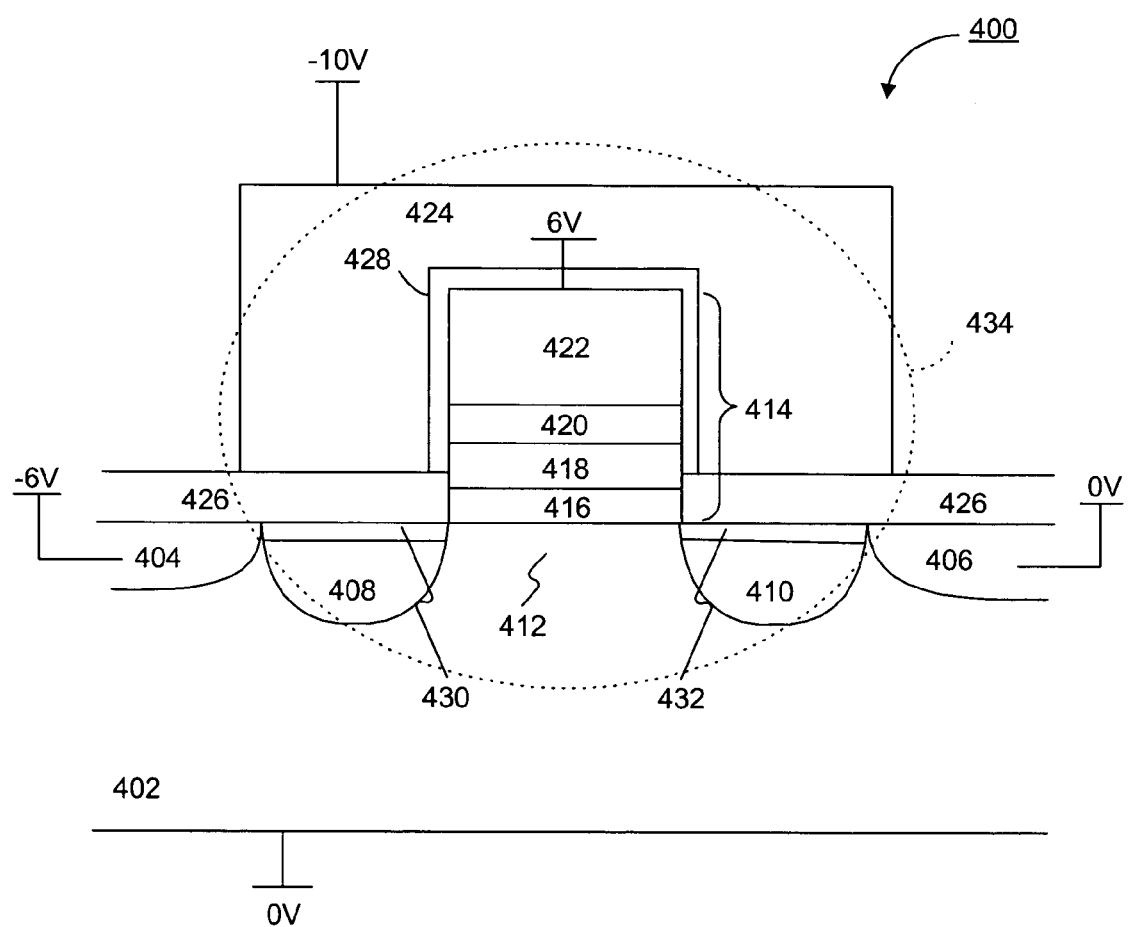

As shown in FIG. 5C, memory cell 400 may be programmed by biasing sub-gate 424 at −10V, control gate 422 at 6V, diffusion region 404 is biased at −6V, and both diffusion region 406 and semiconductor substrate 402 at 0V. Thus, n⁻ diffusion region 408 may also be considered as biased at 0V. Because p-type inversion regions 430 and 432 are conductive, p-type inversion regions 430 and 432 may also be considered as respectively biased at −6V and 0V. Thus, the p-n junction between p-type inversion region 430 and n⁻ diffusion region 408 is highly reverse biased (−6V), and a deep depletion junction is created. Electrons tunnel across the depletion junction from the valence band of p-type region 430 to the conduction band of n⁻ diffusion region 408. Such band-to-band-tunneling induced hot electrons (BTBTHE) gain energy along channel region 412 due to the bias difference between diffusion regions 406 and 404, and further tunnel through first dielectric layer 416 into trapping layer 418 due to the vertical electric field created by the positive bias on control gate 422. Thus, the hole concentration in channel region 412 is higher when memory cell 400 is in the programmed state than when memory cell 400 is in the reset state, and the threshold voltage of MOS transistor 434 in the programmed state, $V_{TH-P}$, is higher than that in the reset state, $V_{TH-R}$. For example, $V_{TH-P}$ may be around 6~7V.

Consistent with the present invention, n⁻ diffusion region 408 and 410 have higher doping concentrations than semiconductor substrate 402. Therefore, the depletion junction between p-type inversion region 430 and n⁻ diffusion region 408 has a narrower width and a stronger electric field than that between p-type region 228 and n⁻ semiconductor substrate 202 of memory cell 200 when the first bit of memory cell 200 is programmed. Thus, the BTBTHE injection efficiency and programming efficiency of memory cell 400 are higher than that of memory cell 200.

Figure 5D:
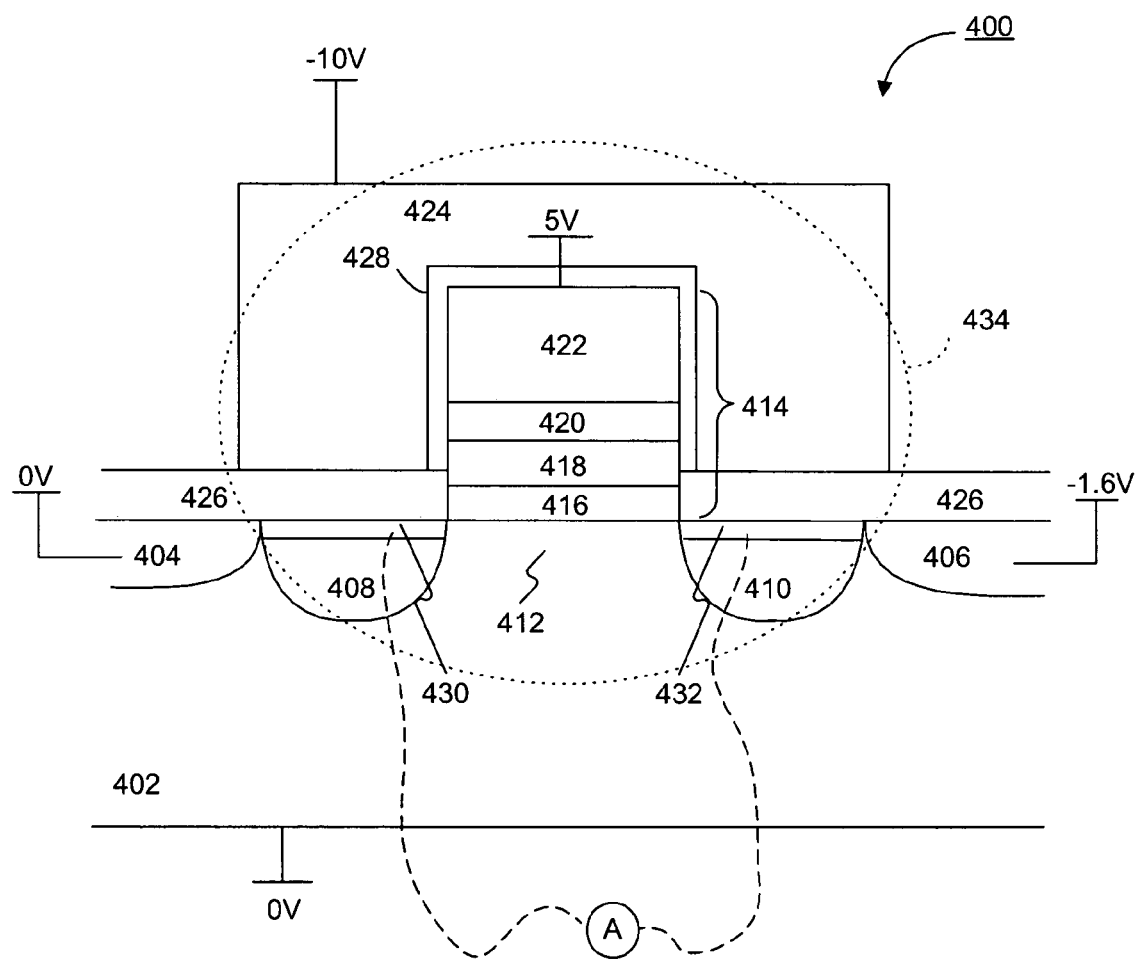

As shown in FIG. 5D, memory cell 400 may be read by biasing sub-gate 424 at, e.g., −10V, control gate 422 at, e.g., 5V, diffusion region 404 at, e.g., 0V, diffusion region 406 at, e.g., −1.6V, and semiconductor substrate 402 at, e.g., 0V, and measuring a current through channel region 412. Because $V_{TH-R}$<5V<$V_{TH-P}$, a current is detected if memory cell 400 has been programmed under the biasing scheme of FIG. 5C, and no current is detected if memory cell 400 is not programmed or is in the reset state.

Under the biasing scheme of FIG. 5C, the accelerated electrons gain most of their energy in the neighborhood of p-type inversion region 430 and tunnel through first dielectric layer 416 into the left portion of trapping layer 418 that is adjacent to p-type inversion region 430. As a result, the hole concentration in the left portion of channel region 412 is higher than when memory cell 400 is in the reset state. In other words, only the threshold voltage of the left side of MOS transistor 434 is affected under the biasing condition of FIG. 5C. Similarly, the biasing condition in FIG. 5D only allows for the determination of whether MOS transistor 434 has been programmed under the biasing condition of FIG. 5C. Thus, it is possible to operate memory cell 400 to store two bits of information, with a first bit corresponding to p-type inversion region 430 and a second bit corresponding to p-type inversion region 432. The first bit may be programmed or read as discussed above, while the second bit may be programmed or read by respectively switching the biases on p-type inversion regions 430 and 432 in FIGS. 5C and 5D.

Figure 6A:
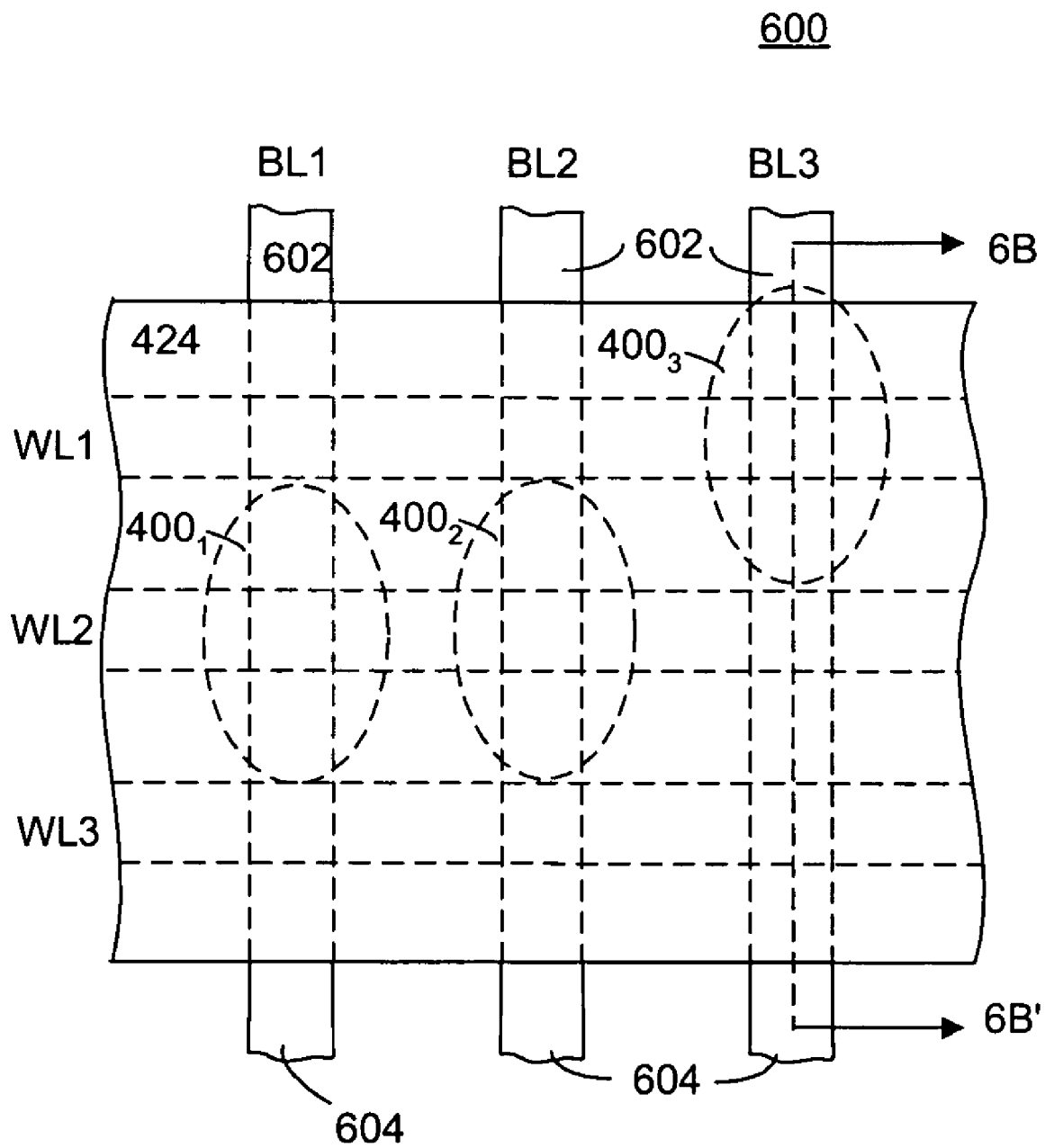
FIG. 6A shows a plan view of a memory array consistent with a second embodiment of the present invention.
Figure 6B:
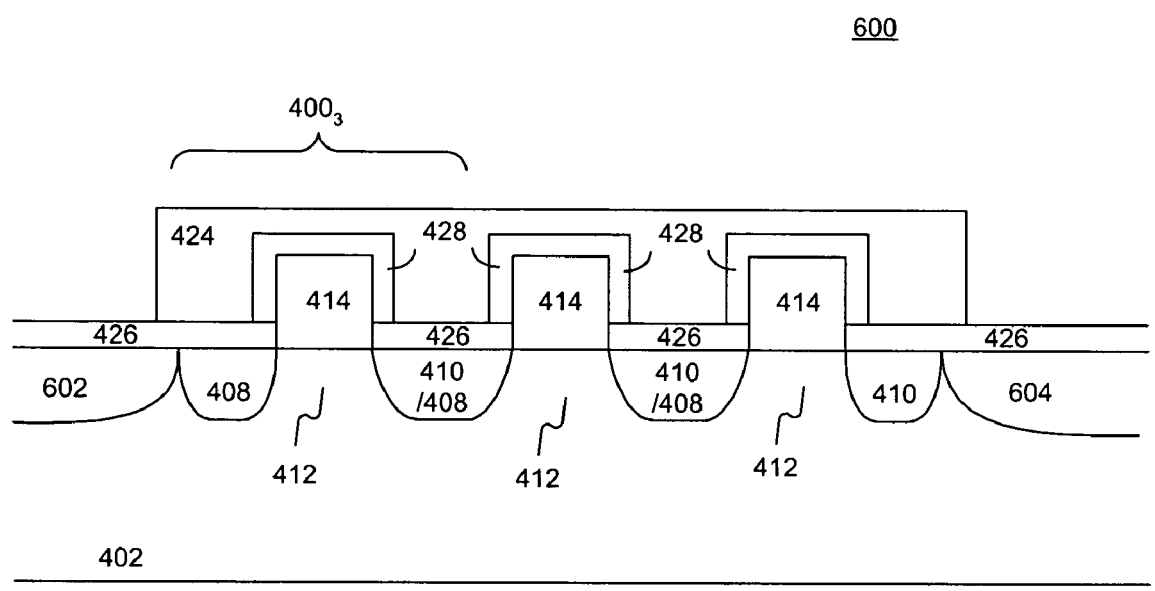
FIG. 6B shows a cross-sectional view of the memory array of FIG. 6A along line 6B-6B'.

Consistent with a second embodiment of the present invention, a plurality of memory cells 400 may be arranged to form a memory array. FIG. 6A is a plan view of a memory array 600 formed of a plurality of memory cells 400 ($400_1$, $400_2$, $400_3$, ...) arranged in a plurality of rows each corresponding to a word line WL (WL1, WL2, WL3, ...) and a plurality of columns each corresponding to a bit line BL (BL1, BL2, BL3, ...). FIG. 6B is a cross-sectional view of memory array 600 along line 6B-6B' of FIG. 6A. Gate structures 414 of memory cells 400 in the same row are connected together and comprise the corresponding word line WL. Each bit line includes two $p^+$ diffusion regions 602 and 604 at the ends thereof, and also includes $n^-$ diffusion regions 408 and 410 of memory cells 400 in the same column. As shown in FIGS. 6A and 6B, all memory cells 400 of memory array 600 share one sub-gate 424.

Figure 6C:
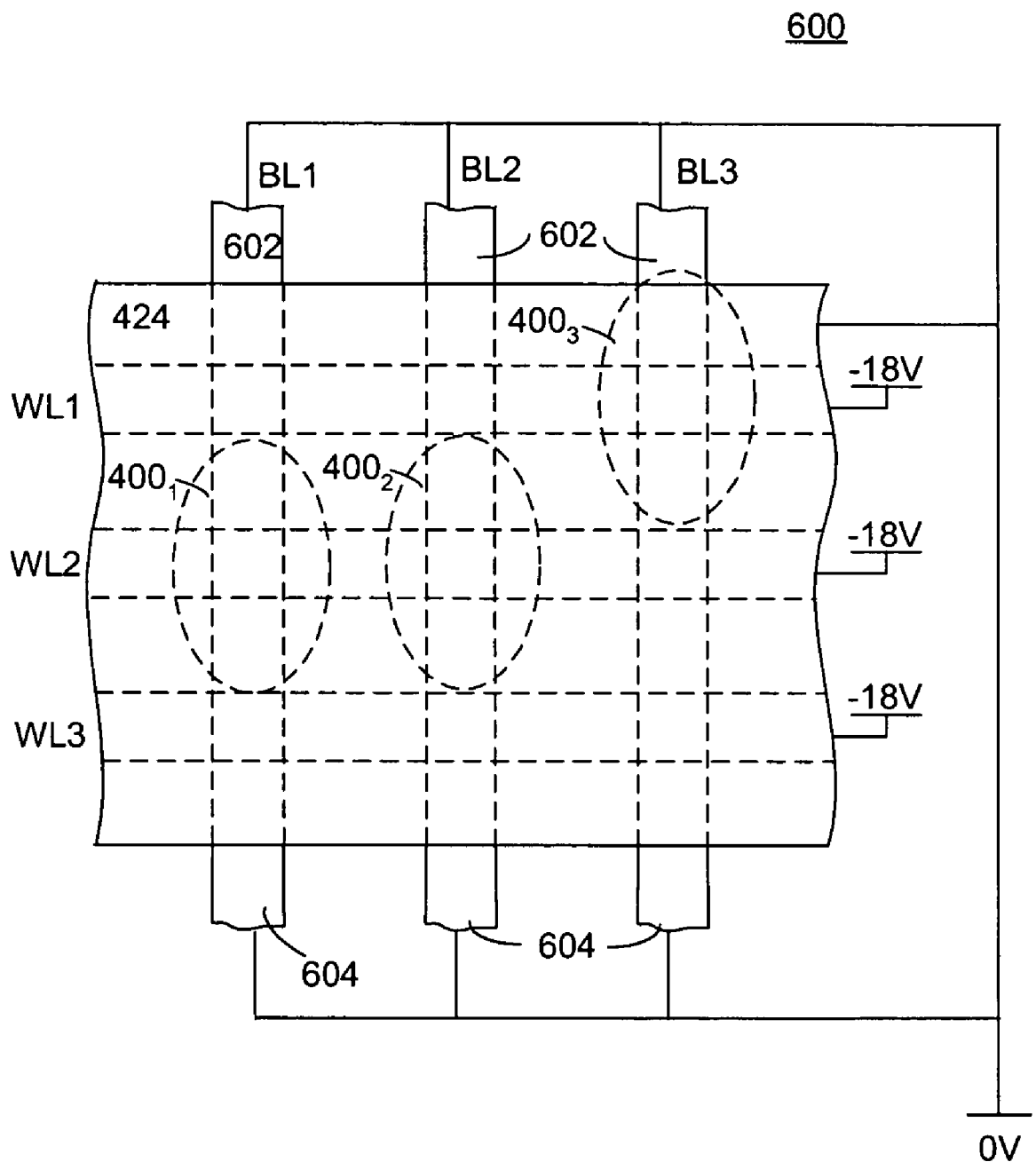
Figure 6D:
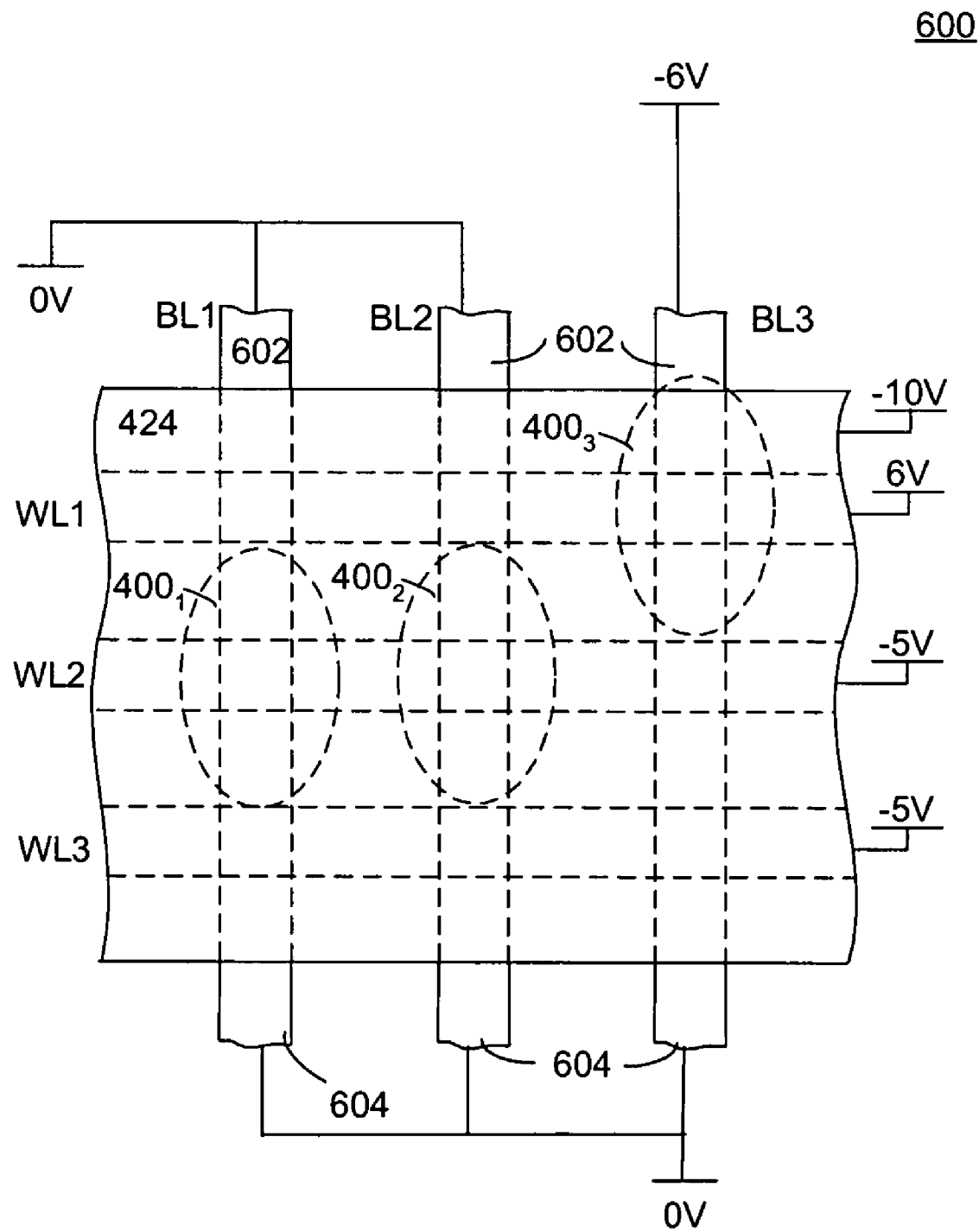
Figure 6E:
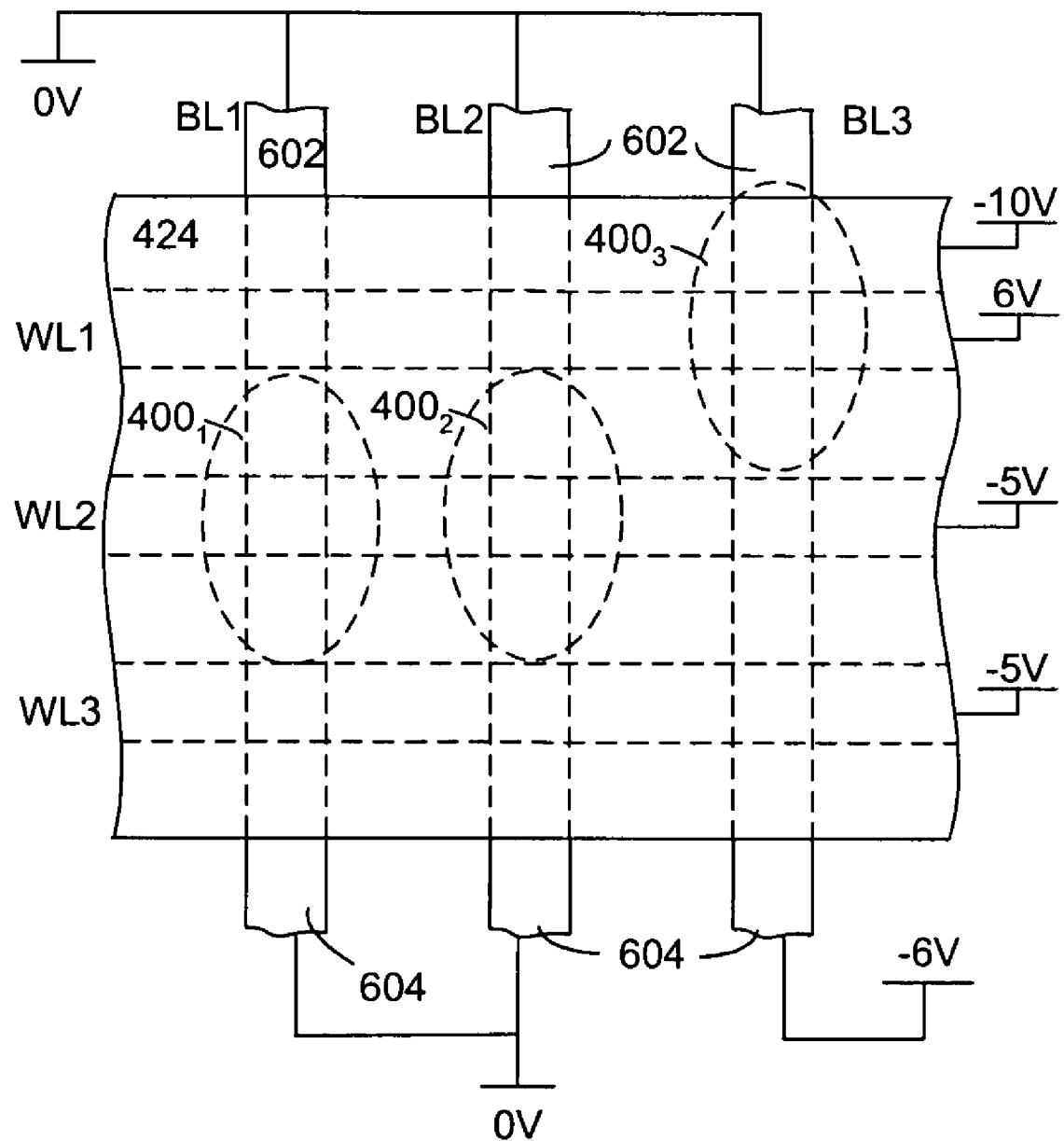
Figure 6F:
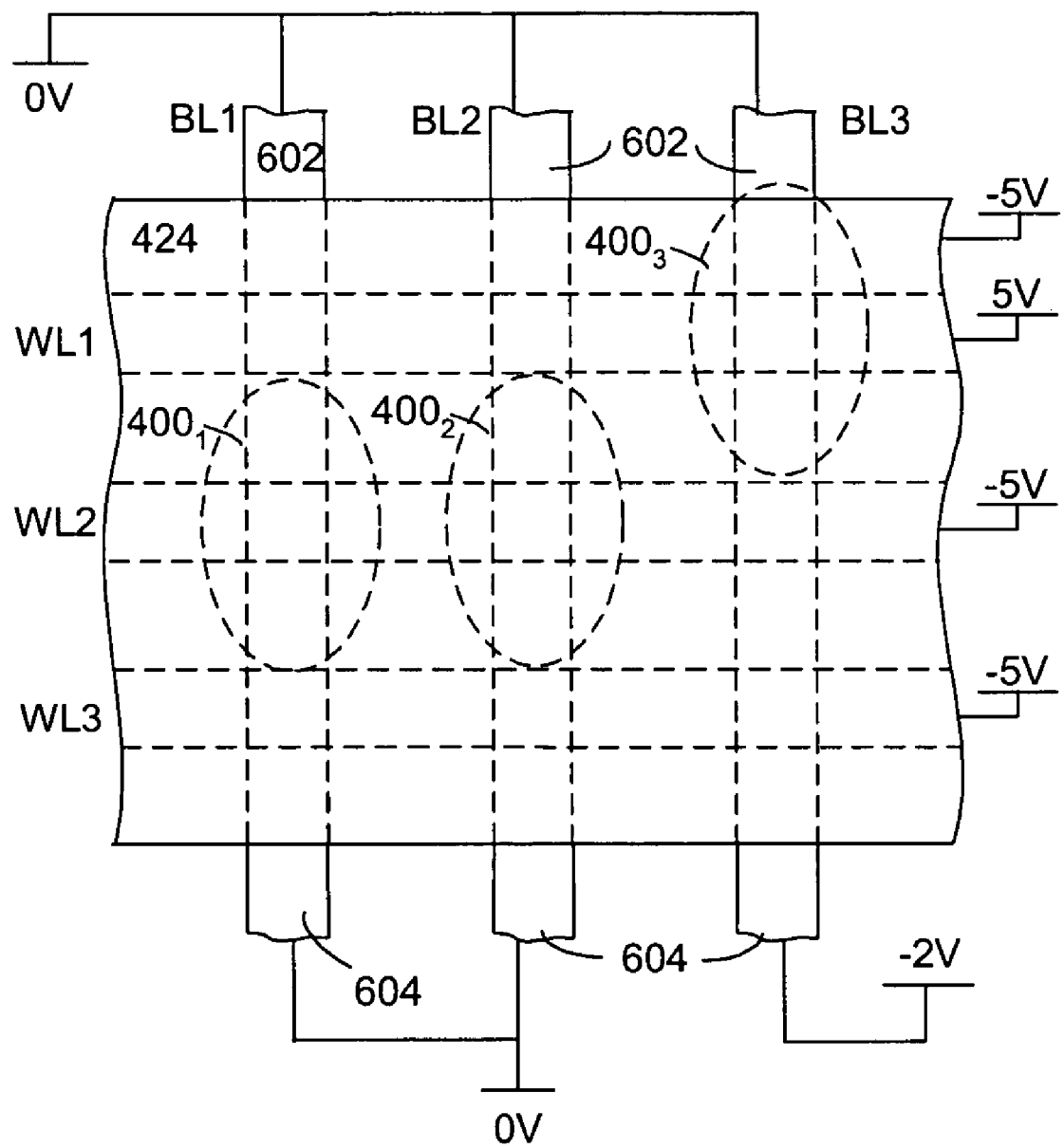
Figure 6G:
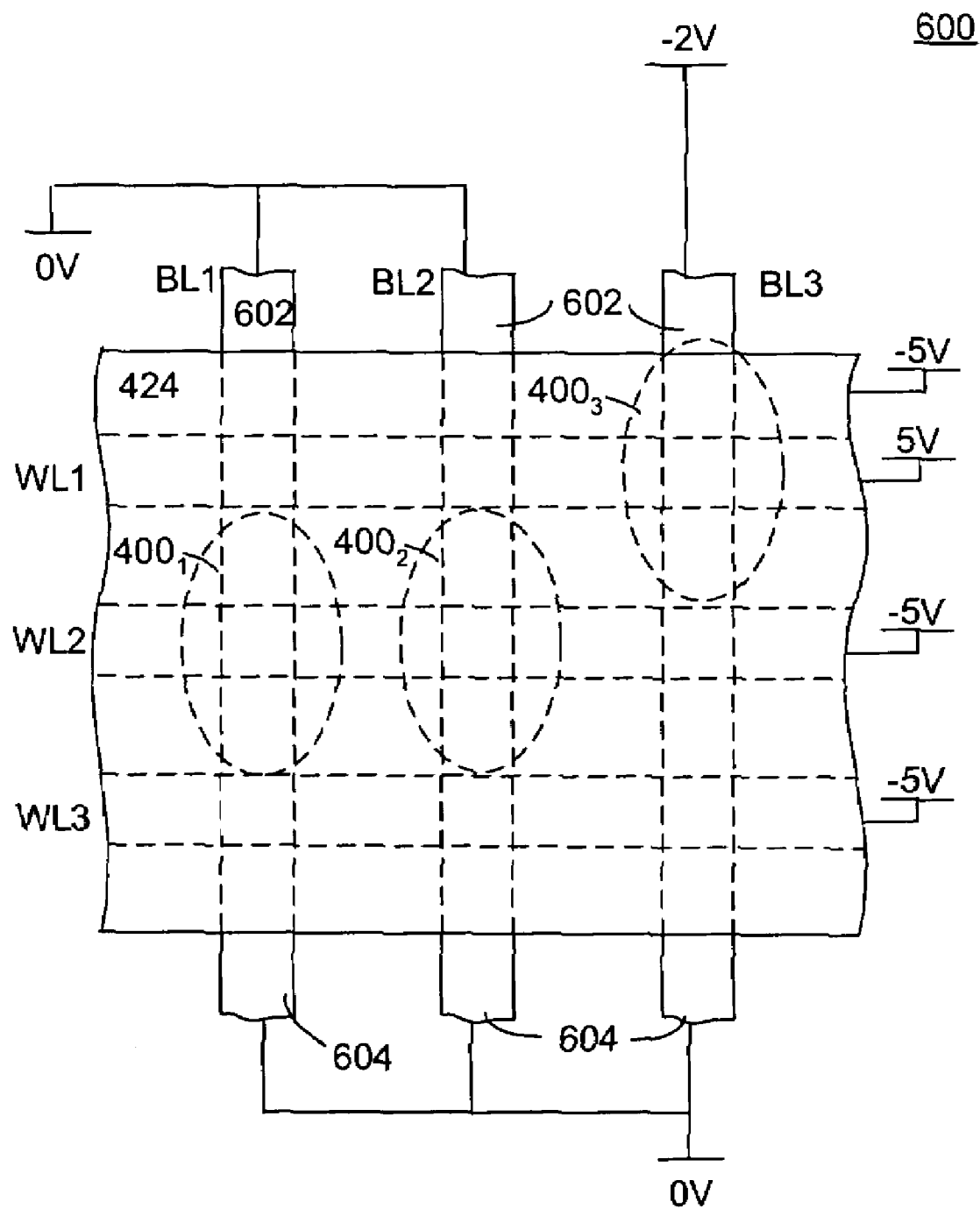

FIGS. 6C-6G illustrate operations of memory array 600. In FIG. 6C, memory array 600 is reset or erased by biasing word lines WL at a negative voltage, e.g., −18V, while semiconductor substrate 402 is grounded or biased at a positive voltage (not shown). Diffusion regions 602 and 604 of the bit lines BL and sub-gate 424 are grounded. In FIG. 6D, the first bit of memory cell $400_3$ is programmed by biasing the corresponding word line, WL1, at, e.g., 6V, diffusion region 602 of the corresponding bit line, BL3, at, e.g., −6V, diffusion regions 602 of all other bit lines BL and diffusion regions 604 of all the bit lines BL at, e.g., 0V, all other word lines WL at, e.g., −5V, and sub-gate 424 at, e.g., −10V. In FIG. 6E, the second bit of memory cell $400_3$ is programmed by biasing the corresponding word line, WL1, at, e.g., 6V, diffusion region 604 of the corresponding bit line, BL3, at, e.g., −6V, diffusion regions 604 of all other bit lines BL and diffusion regions 602 of all the bit lines BL at, e.g., 0V, all other word lines WL at, e.g., −5V, and sub-gate 424 at, e.g., −10V. In FIG. 6F, the first bit of memory cell $400_3$ is read by biasing the corresponding word line, WL1, at, e.g., 5V, diffusion region 604 of the corresponding bit line, BL3, at, e.g., −2V, diffusion regions 604 of all other bit lines BL and diffusion regions 602 of all the bit lines BL at, e.g., 0V, and all other word lines WL and sub-gate 424 at, e.g., −5V, and measuring (not shown) the current between diffusion regions 602 and 604 of the corresponding bit line, BL3. In FIG. 6G, the second bit of memory cell $400_3$ is read by biasing the corresponding word line, WL1, at, e.g., 5V, diffusion region 602 of the corresponding bit line, BL3, at, e.g., −2V, diffusion regions 602 of all other bit lines BL and diffusion regions 604 of all the bit lines BL at, e.g., 0V, and all other word lines WL and sub-gate 424 at, e.g., −5V, and measuring (not shown) the current between diffusion regions 602 and 604 of the corresponding bit line, BL3.

Figure 7:
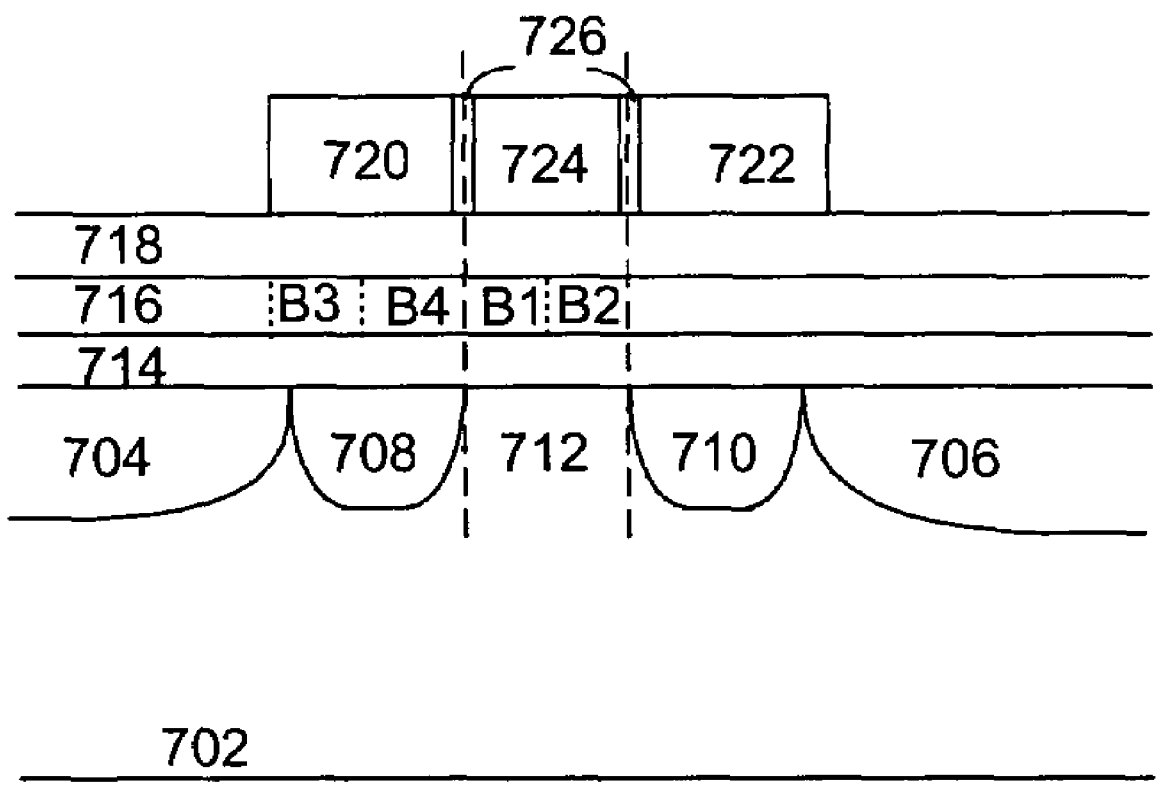

Consistent with a third embodiment of the present invention, a multi-bit memory cell is provided. FIG. 7 shows a multi-bit memory cell 700 formed on an $n^-$ semiconductor substrate 702 including p-type diffusion regions 704 and 706 spaced apart from each other. Semiconductor substrate 702 also includes two $n^-$ diffusion region 708 and 710 spaced apart from each other and between p-type diffusion regions 704 and 706. $N^-$ diffusion regions 708 and 710 have higher concentrations of n-type dopants than $n^-$ semiconductor substrate 702. A channel region 712 is defined between $n^-$ diffusion regions 708 and 710. A first insulating layer 714, a trapping layer 716, and a second insulating layer 718 are sequentially provided on semiconductor substrate 702. First insulating layer 714 may comprise silicon dioxide, trapping layer 716 may comprise silicon nitride, and second insulating layer 718 may comprise silicon dioxide. A first sub-gate 720 is formed on second insulating layer 718 and over $n^-$ diffusion region 708. A second sub-gate 722 is formed on second insulating layer 718 and over $n^-$ diffusion region 710. Sub-gates 720 and 722 may comprise polysilicon, a metal, or a metal silicide, or a combination thereof. A control gate 724 is formed on second insulating layer 718 and between first sub-gate 720 and second sub-gate 722. Control gate 724 may comprise polysilicon, a metal, or a metal silicide, or a combination thereof. For example, control gate 724 may comprise a combination of polysilicon and tungsten silicide (WSi). Sub-gates 720 and 722 are electrically isolated from control gate 724 by insulating spacers 726.

As shown in FIGS. 4 and 7, memory cell 700 differs from memory cell 400 in two aspects: first, gate dielectric 426 of memory cell 400 is now replaced with first insulating layer 714, trapping layer 716, and second insulating layer 718; second, sub-gate 424 is now divided into two sub-gates 720 and 722. With the configuration shown in FIG. 7, memory cell 700 may be operated to store more than two bits of information.

In one aspect, a first bit B1 may be stored in the left side of the portion of trapping layer 716 under control gate 724, a second bit B2 may be stored in the right side of the portion of trapping layer 716 under control gate 724, a third bit B3 may be stored in the left side of the portion of trapping layer 716 under first sub-gate 720, and a fourth bit B4 may be stored in the right side of the portion of trapping layer 716 under first sub-gate 720. One skilled in the art should now appreciate the operations of memory cell 700, i.e., the operations for reading, programming, and erasing the first to fourth bits of memory cell 700. For example, to read the second bit B2, diffusion region 706 is grounded, diffusion region 704 is biased at, e.g., −2V, control gate 724 is biased at, e.g., 3V, and sub-gates 720 and 722 are biased at, e.g., −5V. To program the third bit B3, both control gate 724 and second sub-gate 722 are biased at, e.g., −5V, first sub-gate 720 is biased at, e.g., 6V, diffusion region 704 is based at, e.g., −6V, and diffusion region 706 is grounded. To erase memory cell 700, a high negative voltage, such as −18V, is applied to control gate 724 and sub-gates 720 and 722, while substrate 702 is grounded or biased at a positive voltage.

Figure 8A:
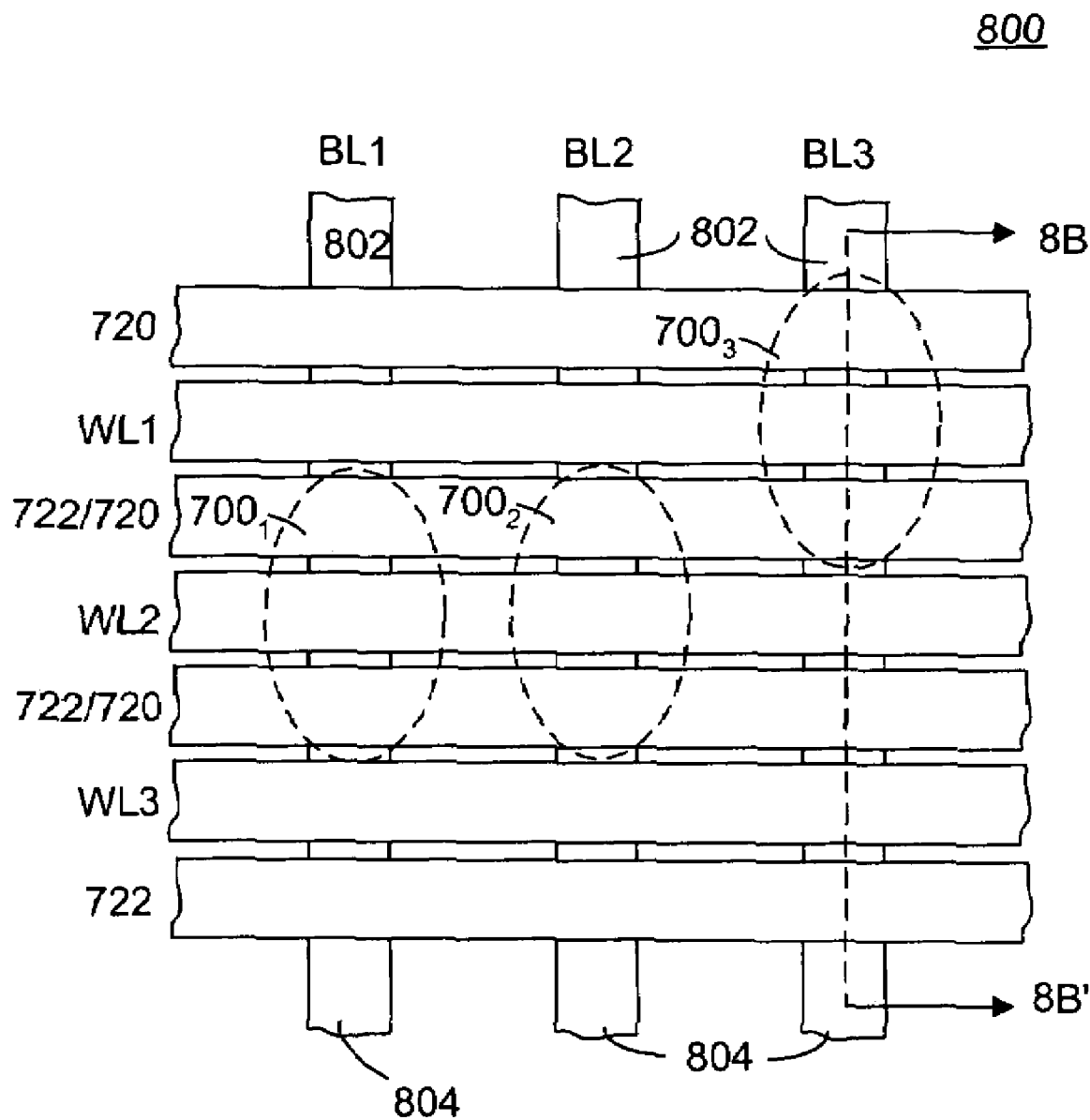
FIG. 8A shows a plan view of a memory array consistent with a fourth embodiment of the present invention.
Figure 8B:
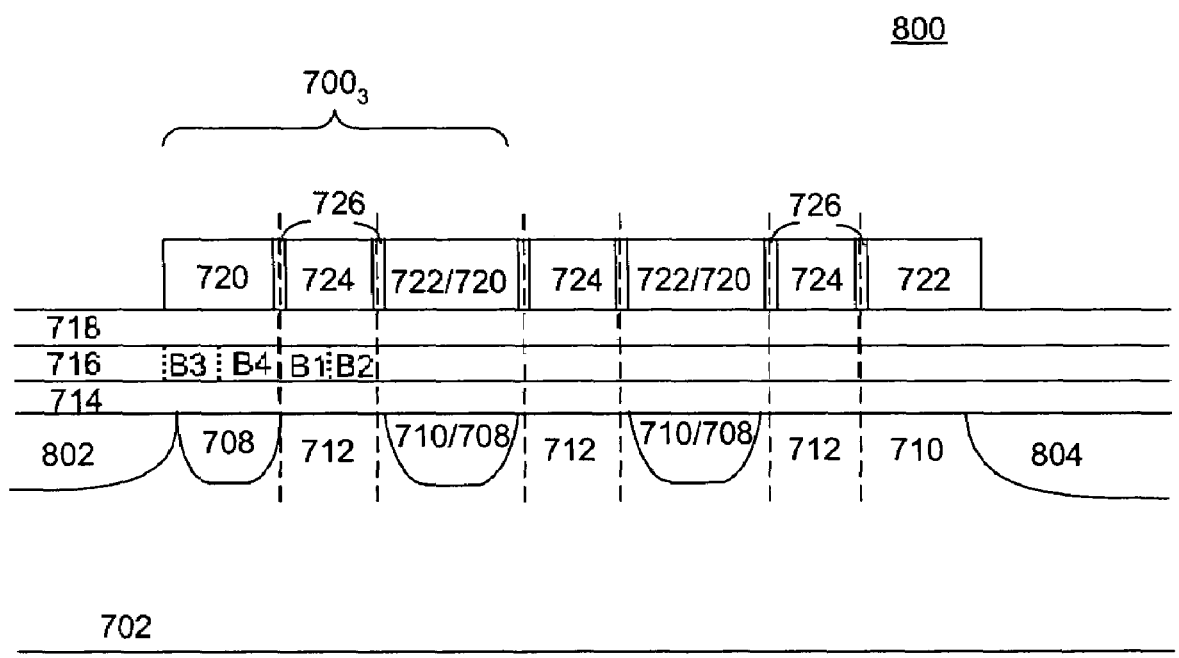
FIG. 8B shows a cross-sectional view of the memory array of FIG. 8A along line 8B-8B'.

Consistent with a fourth embodiment of the present invention, a plurality of memory cells 700 ($700_1$, $700_2$, $700_3$, ...) may be arranged to form a memory array, such as a memory array 800 in FIGS. 8A and 8B. FIG. 8A is a plan view of memory array 800 and FIG. 8B is a cross-sectional view of memory array 800 along line 8B-8B' of FIG. 8A. As shown in FIG. 8A, memory array 800 has a plurality of rows each corresponding to a word line WL (WL1, WL2, WL3, ...) and a plurality of columns each corresponding to a bit line BL (BL1, BL2, BL3, ...). Control gate 724 of memory cells 700 in the same row are connected together and comprise the corresponding word line WL. Each bit line includes two p-type diffusion regions 802 and 804 at the ends thereof, and also includes n⁻ diffusion regions 708 and 710 of memory cells 700 in the same column. Unlike memory array 600, sub-gates 720 and 722 of memory cells 700 in the same column of memory array 800 are not connected together. As compared to memory array 600, memory array 800 has a higher storage density.

Memory devices consistent with embodiments of the present invention may be formed using typical MOS fabrication techniques. A process for manufacturing memory cell 400 is described with reference to FIGS. 9A-9C.

Figure 9A:
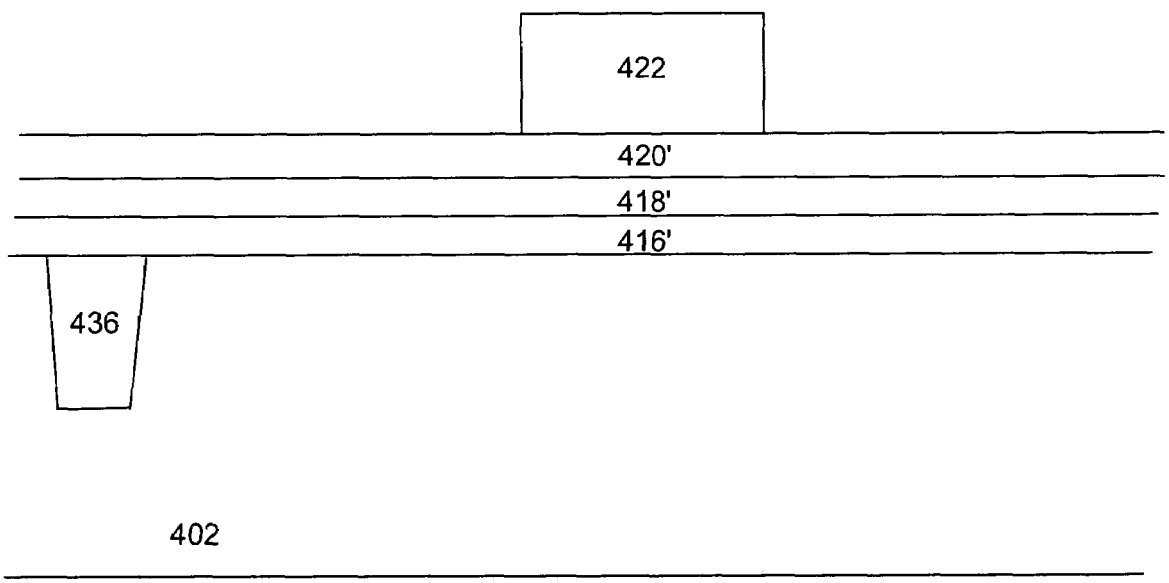
FIGS. 9A-9E illustrate a manufacturing process of the memory cell consistent with the first embodiment of the present invention.

First, in FIG. 9A, after device isolation regions 436 (only one of which is shown) such as shallow trench isolations are formed for defining device regions, a first oxide layer 416', a nitride layer 418', and a second oxide layer 420' are sequentially deposited on silicon substrate 402. A layer of polysilicon or metal is deposited on second oxide layer 420' and patterned to form control gate 422.

Figure 9B:
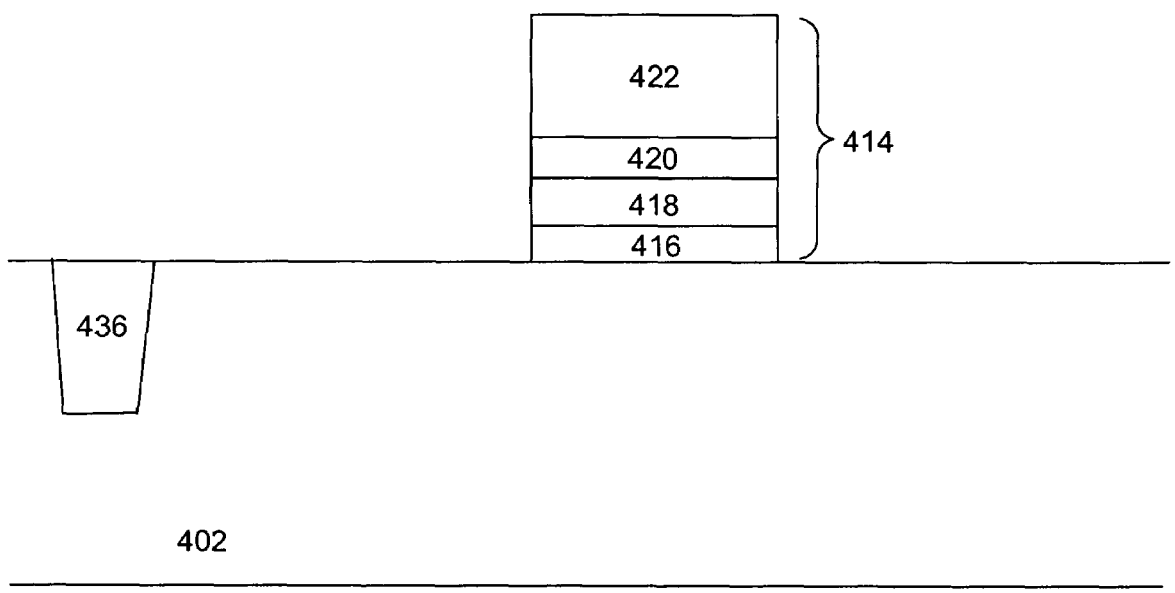

In FIG. 9B, first oxide layer 416', nitride layer 418', and second oxide layer 420' are etched to form an ONO structure composed of first oxide layer 416, nitride layer 418, and second oxide layer 420, using control gate 422 as a mask. Thus, gate structure 414 is formed.

Figure 9C:
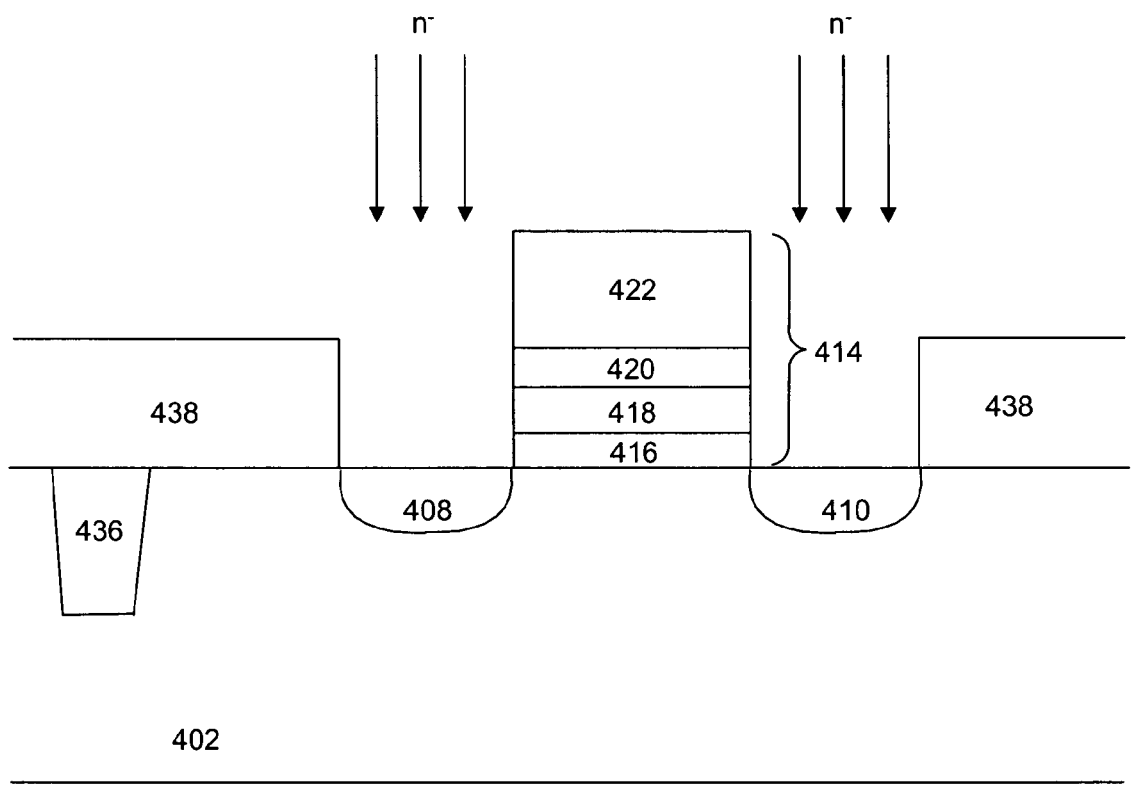

In FIG. 9C, an ion implantation is carried out to form n⁻ diffusion regions 408 and 410 in semiconductor substrate 402, using control gate 422 and the ONO structure as a mask. Other mask patterns such as photoresist patterns 438 may be used if necessary.

Figure 9D:
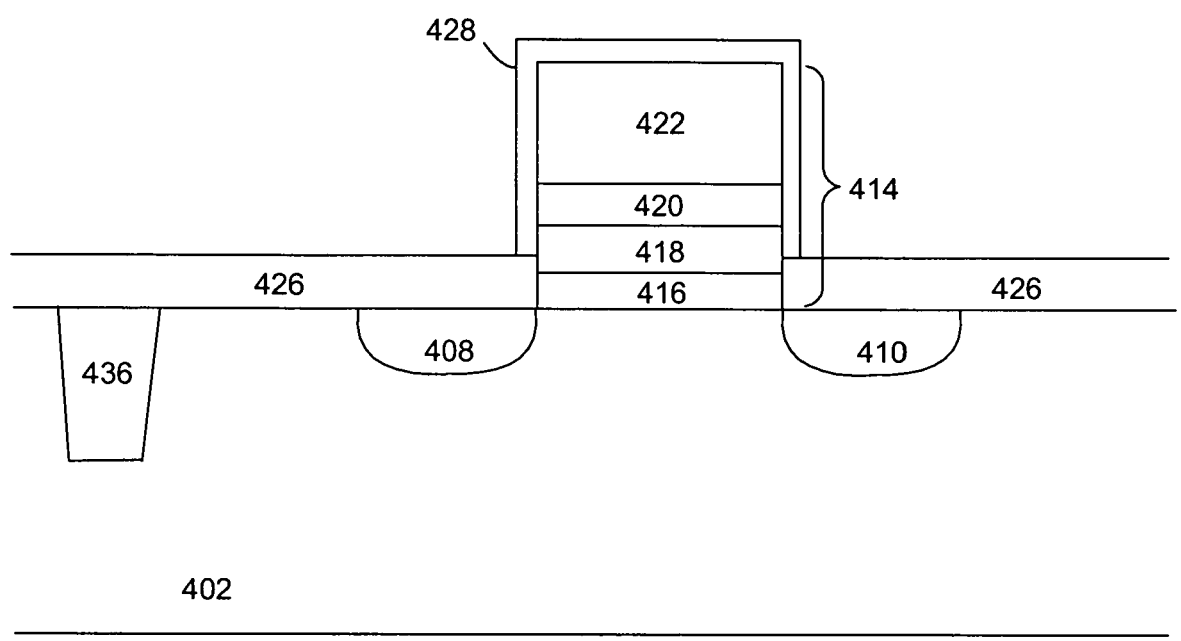

In FIG. 9D, after photoresist patterns 438 are removed, a layer of oxide is deposited to form gate dielectric 426. Insulating spacer 428 may be formed simultaneously. Alternatively, insulating spacer 428 may be formed as a nitride in a separate processing step.

Figure 9E:
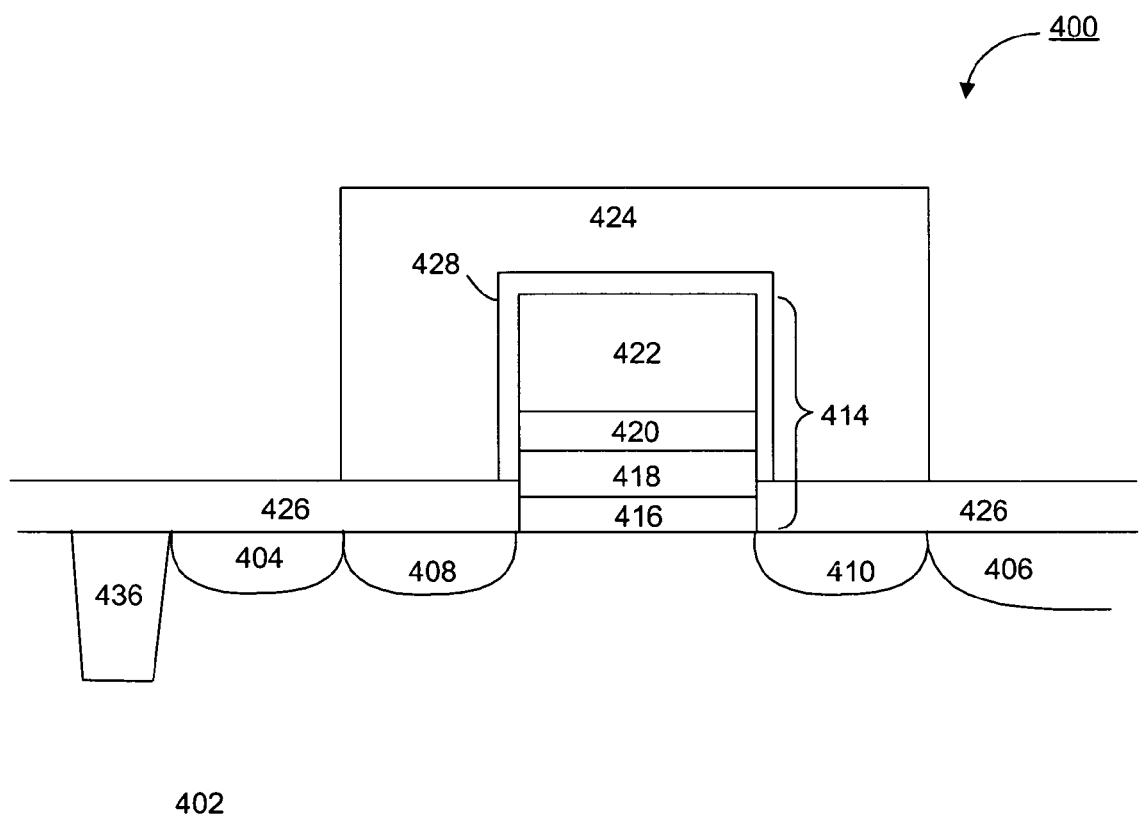

In FIG. 9E, a layer of polysilicon or metal is deposited and patterned to form sub-gate 424, followed by ion implantation and diffusion to form p⁺ diffusion regions 404 and 406.

Alternatively, n diffusion regions 408 and 410 may be formed before first oxide layer 416', nitride layer 418', and second oxide layer 420' are etched. Particularly, an ion implantation may be carried out using control gate 422 as a mask and the ions may be implanted into substrate 402 through first oxide layer 416', nitride layer 418', and second oxide layer 420'.

The manufacturing process of memory cell 700 is performed in a manner analogous to the above described process for manufacturing memory cell 400 and should now be clear to one skilled in the art and is not described herein.

Memory devices consistent with embodiments of the present invention have advantages over conventional memory devices because n⁻ diffusion regions having higher concentrations of n-type dopants are created in the semiconductor substrate and p-type inversion regions are created in the n⁻ diffusion regions, such that the depletion junction between the p-type inversion regions and the n⁻ diffusion regions is narrow and has a strong electric field to sweep electrons from the p-type inversion region into the n⁻ diffusion regions, thereby increasing a hot electron injection efficiency and programming efficiency. Also, problems associated with ion implantation and boron diffusion in short channel MOS devices are obviated.

It will be apparent to those skilled in the art that various modifications and variations can be made to the disclosed device and processes without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a semiconductor substrate having a first conductivity type, including
      a first diffusion region having the first conductivity type,
      a second diffusion region having the first conductivity type, and
      a channel region between the first diffusion region and the second diffusion region;
   a control gate over the channel region; and
   a contiguous sub-gate formed over the first diffusion region, the second diffusion region, and the control gate,
   wherein the sub-gate produces a first inversion region and a second inversion region in the first diffusion region and the second diffusion region, respectively, when an appropriate bias is applied to the sub-gate.

2. The device of claim 1, wherein the first conductivity type is n-type.

3. The device of claim 1, wherein the first diffusion region and the second diffusion region have higher doping concentrations than the semiconductor substrate.

4. The device of claim 1, wherein at least one of the first inversion region or second inversion region having a second conductivity type is formed in one of the first and second diffusion regions, wherein the semiconductor substrate further includes a third diffusion region having the second conductivity type, and wherein the inversion region is connectable to the third diffusion region for receiving a voltage bias.

5. The device of claim 1, wherein the control gate comprises polysilicon, a metal, or a metal silicide, or a combination thereof.

6. The device of claim 1, further comprising:
   a first insulating layer over the channel region;
   a trapping layer on the first insulating layer; and
   a second insulating layer on the trapping layer,
   wherein the control gate is over the second insulating layer.

7. The device of claim 1, wherein the sub-gate comprises polysilicon, a metal, or a metal silicide, or a combination thereof.

8. The device of claim 1, further comprising a layer of gate dielectric between the sub-gate and the first and second diffusion regions.

9. The device of claim 1, further comprising:
   a first insulating layer on the channel region and the first and second diffusion regions;
   a trapping layer on the first insulating layer; and
   a second insulating layer on the trapping layer,
   wherein the sub-gate comprises a first sub-gate over the first diffusion region and a second sub-gate over the second diffusion region, and wherein the first sub-gate, the second sub-gate, and the control gate are all on the second insulating layer.

10. A memory device, comprising:
a semiconductor substrate having a first conductivity type;
a plurality of memory cells arranged in a plurality of rows each corresponding to one of a plurality of word lines and a plurality of columns each corresponding to one of a plurality of bit lines, each memory cell comprising:
a first diffusion region having the first conductivity type in the semiconductor substrate,
a second diffusion region having the first conductivity type in the semiconductor substrate,
a channel region as a portion of the semiconductor substrate between the first and second diffusion regions,
a control gate over the channel region, and
a contiguous sub-gate formed over the first diffusion region, the second diffusion region, and the control gate,
wherein the control gate is connected to the corresponding one of the word lines, and
wherein the sub-pate produces a first inversion region and a second inversion region in the first diffusion region and the second diffusion region. respectively, when an appropriate bias is applied to the sub-gate; and
a plurality of third diffusion regions having a second conductivity type, wherein each bit line includes two of the third diffusion regions at the ends of the corresponding bit line,
wherein the sub-gate and the plurality of word lines run in a parallel direction.

11. The device of claim 10, wherein the first conductivity type is n-type, and the second conductivity type is p-type.

12. The device of claim 10, wherein the first diffusion region and the second diffusion region of each memory cell have higher doping concentrations than the semiconductor substrate.

13. The device of claim 10, wherein the control gates of the memory cells comprise polysilicon, a metal, or a metal silicide, or a combination thereof.

14. The device of claim 10, each memory cell further comprising:
a first insulating layer on the channel region;
a trapping layer on the first insulating layer; and
a second insulating layer on the trapping layer,
wherein the control gate is over the second insulating layer.

15. The device of claim 10, wherein the sub-gate of the memory cells comprise polysilicon, a metal, or a metal silicide, or a combination thereof.

16. The device of claim 10, each memory cell further comprising a layer of gate dielectric between the sub-gate and the first and second diffusion regions.

17. The device of claim 10, wherein the sub-gates of each column of the memory cells are electrically connected to one another and each memory cell is capable of storing two bits of information.

18. The device of claim 10, wherein a pair of adjacent memory cells in each column share the sub-gate thereof.

19. The device of claim 10, wherein a pair of adjacent memory cells on the same bit line share one of the first and second diffusion regions.

20. The device of claim 10, each memory cell further comprising:
a first insulating layer on the channel region and the first and second diffusion regions;
a trapping layer on the first insulating layer; and
a second insulating layer on the trapping layer,
wherein the sub-gate comprises a first sub-gate over the first diffusion region and a second sub-gate over the second diffusion region, and wherein the first sub-gate, the second sub-gate, and the control gate are all on the second insulating layer.

21. The device of claim 10, wherein the sub-gate of each memory cell comprises a first sub-gate over the corresponding first diffusion region and a second sub-gate over the corresponding second diffusion region, and wherein each memory cell is capable of storing four bits of information.

* * * * *

UNITED STATES PATENT AND TRADEMARK OFFICE
CERTIFICATE OF CORRECTION

| | |
|---|---|
| PATENT NO. | : 7,652,320 B2 |
| APPLICATION NO. | : 11/070226 |
| DATED | : January 26, 2010 |
| INVENTOR(S) | : Wu et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 397 days.

Signed and Sealed this

Twenty-third Day of November, 2010

David J. Kappos
*Director of the United States Patent and Trademark Office*